US006100165A

United States Patent [19]
Sakaguchi et al.

[11] Patent Number: 6,100,165
[45] Date of Patent: *Aug. 8, 2000

[54] METHOD OF MANUFACTURING SEMICONDUCTOR ARTICLE

[75] Inventors: Kiyofumi Sakaguchi, Yokohama; Takao Yonehara, Atsugi, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/971,040

[22] Filed: Nov. 14, 1997

[30] Foreign Application Priority Data

Nov. 15, 1996 [JP] Japan ................................. 8-304540

[51] Int. Cl.⁷ .......................... H01L 21/30; H01L 21/46
[52] U.S. Cl. ....................... 438/455; 438/458; 438/928; 438/960; 438/977; 438/406; 438/409
[58] Field of Search ................................ 438/455, 458, 438/928, 960, 609, 406, 409

[56] References Cited

U.S. PATENT DOCUMENTS

| 4,816,420 | 3/1989 | Bozler . | |
|---|---|---|---|
| 5,352,635 | 10/1994 | Tu | 437/228 |
| 5,371,037 | 12/1994 | Yonehara | 437/86 |
| 5,849,627 | 12/1998 | Linn et al. | 438/455 |
| 5,852,346 | 12/1998 | Komoda et al. | 315/169.3 |

FOREIGN PATENT DOCUMENTS

| 0757377 | 2/1997 | European Pat. Off. | H01L 21/20 |
|---|---|---|---|
| 0 793 263 | 9/1997 | European Pat. Off. . | |
| 5-21338 | 1/1993 | Japan . | |
| 7-302889 | 11/1995 | Japan . | |
| 92/06394 | 4/1992 | WIPO . | |
| 92/09104 | 5/1992 | WIPO . | |

OTHER PUBLICATIONS

K. Imai, "A New Dielectric Isolation Method Using Porous Silicon", Sol. State Elec., vol. 24, No. 2, Feb. 1, 1981.

T. Yonehara, "Epitaxial Layer Transfer by Bond And Etch Back Of Porous Si", App. Phys. Lett., vol. 64, No. 16, Apr. 18, 1994.

Imai, "Crystalline Quality of Silicon Layer Formed by Fipos Technology", J. Crystal Growth, vol. 63, No. 3, pp. 547–553.

Maszara, "Silicon–On–Insulator by Wafer Bonding: A Review", J. Electrochem. Soc., vol. 138, No. 1, pp. 341–347 (1991).

(List continued on next page.)

*Primary Examiner*—John F. Niebling
*Assistant Examiner*—David A. Zarneke
*Attorney, Agent, or Firm*—Fitzpatrick, Cella, Harper & Scinto

[57] ABSTRACT

A method of manufacturing a semiconductor article comprises steps of forming a diffusion region at least on the surface of one of the sides of a silicon substrate by diffusing an element capable of controlling the conduction type, forming a porous silicon layer in a region including the diffusion region, preparing a first substrate by forming a nonporous semiconductor layer on the porous silicon layer, bonding the first substrate and a second substrate together to produce a multilayer structure with the nonporous semiconductor layer located inside, splitting the multilayer structure along the porous silicon layer but not along the diffusion region and removing the porous silicon layer remaining on the split second substrate.

55 Claims, 5 Drawing Sheets

OTHER PUBLICATIONS

Harendt, "Silicon on Insulator Material by Wafer Bonding", J. Elect. Mater., vol. 20, No. 3, pp. 267–277 (1991).

Baumgart, "Light Scattering Topography Characterization of Bonded SOI Wafers", Extended Abstract of ECS First International Symposium of Wafer Bonding, pp. 375–385 (1991).

Hunt, "Thinning of Bonded Wafers: Etch–Stop Approaches", Extended Abstract of ECS First International Symposium of Wafer Bonding, pp. 165–173 (1991).

Yonehara, "Epitaxial layer transfer by bond and etch back of porous Si", Appl. Phys. Lett. vol. 64, No. 16, pp. 2108–2110 (1994).

Uhlir, "Electrolytic Shaping of Germanium and Silicon", Bell Sys. Tech. J., vol. 35, pp. 333–347 (1956).

Unagami, "Formation Mechanism of Porous Silicon Layer by Anodization in HF Solution", J. Electrochem. Soc., vol. 127, No. 2, pp. 476–483 (1980).

Japanese Patent Abstract, Publication No. 03181115A, published Aug. 7, 1991.

Japanese Patent Abstract, Publication No. 05217992A, published Aug. 27, 1993.

METHOD OF MANUFACTURING SEMICONDUCTOR ARTICLE

BACKGROUND OF THE INVENTION

1. Field of the Invention

This invention relates to a method of manufacturing a semiconductor article that can suitably be used for producing a semiconductor device such as a semiconductor integrated circuit, a solar cell, a semiconductor laser device or a light emitting diode. More particularly, it relates to a method of manufacturing a semiconductor article comprising a step of transferring a semiconductor layer onto a substrate.

2. Related Background Art

Semiconductor articles are popular in terms of semiconductor wafers, semiconductor substrates and various semiconductor devices and include those adapted for producing semiconductor devices by utilizing the semiconductor region thereof and those used as preforms for producing semiconductor devices.

Some semiconductor articles of the type under consideration comprise a semiconductor layer arranged on an insulator.

The technology of forming a single crystal silicon semiconductor layer on an insulator is referred to as silicon on insulator (SOI) technology, which is widely known. Various researches have been done to exploit the remarkable advantages of SOI that cannot be achieved by using bulk Si substrates that are used for producing ordinary Si integrated circuits. The advantages of the SOI technology include:

1. the ease of dielectric isolation that allows an enhanced degree of integration;
2. the excellent resistivity against radiation;
3. a reduced floating capacitance that allows a high device operation speed;
4. the omission of the well forming step;
5. the effect of latch up prevention; and
6. the possibility of producing fully depleted field effect transistors using the thin film technology. The advantages of the SOI technology are thoroughly discussed in Special Issue: "Single-crystal silicon on non-single-crystal insulators"; edited by G. W. Cullen, Journal of Crystal Growth, volume 63, No. 3, pp. 429–590 (1983).

In recent years, a number of reports have been published on the SOI technology for providing substrates that can realize high speed operation and low power consumption for MOSFETs (IEEE SOI conference 1994). The process of manufacturing a semiconductor device can be significantly curtailed by using the SOI structure if compared with the corresponding process of manufacturing a device on a bulk Si wafer because of the implementation of a very simplified device isolation step. Thus, the use of the SOI technology can provide a significant cost reduction in manufacturing a semiconductor device particularly in terms of the wafer cost and the process cost if viewed from the conventional technology of manufacturing a MOSFET or an IC on a bulk Si substrate, to say nothing of the remarkable performance of such a semiconductor device.

Fully depleted MOSFETs are very promising for achieving high speed operation and low power consumption if provided with improved drive power. Generally speaking, the threshold voltage (Vth) of a MOSFET is determined as a function of the impurity concentration of its channel section but, in the case of a fully depleted (FD) MOSFET, the characteristics of the depletion layer is influenced by the SOI film thickness. Therefore, the SOI film thickness has to be rigorously controlled in order to improve the yield of manufacturing LSIs.

Meanwhile, a device formed on a compound semiconductor shows a remarkable level of performance that cannot be expected from silicon particularly in terms of high speed operation and light emission. Such devices are currently formed by means of epitaxial growth on a compound semiconductor substrate that may be made of GaAs or a similar compound. However, a compound semiconductor substrate is costly and mechanically not very strong so that it is not adapted to produce a large wafer.

Thus, efforts have been made to form a compound substrate by hetero-epitaxial growth on an Si wafer that is inexpensive, mechanically strong and good for producing a large wafer.

Researches on forming SOI substrates became remarkable in the 1970s. Initially, attention was paid to the technique of producing single crystal silicon by epitaxial growth on a sapphire substrate (SOS: silicon on sapphire), that of producing an SOI structure through full isolation by porous oxidized silicon (FIPOS) and the oxygen ion implantation technique. The FIPOS method comprises steps of forming an islanded N-type Si layer on a P-type single crystal Si substrate by proton/ion implantation (Imai et al., J.Crystal Growth, Vol. 63,547 (1983)) or by epitaxial growth and patterning, transforming only the P-type Si substrate into a porous substrate by anodization in an HF solution, shielding the Si islands from the surface, and then subjecting the N-type Si islands to dielectric isolation by accelerated oxidation. This technique is, however, accompanied by a problem that the isolated Si region is defined before the process of producing devices to restrict the freedom of device design.

The oxygen ion implantation method is also referred to the SIMOX method, which was proposed by K. Izumi for the first time. With this technique, oxygen ions are implanted into an Si wafer to a concentration level of $10^{17}$ to $10^{18}/cm^2$ and then the latter is annealed at high temperature of about 1,320° C. in an argon/oxygen atmosphere. As a result, the implanted oxygen ions are chemically combined with Si atoms to produce a silicon oxide layer that is centered at a depth corresponding to the projection range (Rp) of the implanted ions. Under this condition, an upper portion of the Si oxide layer that is turned into an amorphous state by the oxygen ion implantation is recrystallized to produce a single crystal Si layer. While the surface Si layer used to show a defect rate as high as $10^5/cm^2$, a recent technological development has made it possible to reduce the defect rate down to about $10^2/cm^2$ by selecting a rate of oxygen implantation of about $4 \times 10^{17}/cm^2$. However, the allowable range of energy infusion and that of ion implantation are limited if the film quality of the Si oxide layer and the crystallinity of the surface Si layer are to be held to respective desired levels and hence the film thickness of the surface Si layer and that of the buried Si oxide (BOX; buried oxide) layer are allowed to take only limited values. In other words, a process of sacrifice oxidation or epitaxial growth is indispensable to realize a surface Si layer having a desired film thickness. Such a process by turn gives rise to a problem of uneven film thickness due to the intrinsic adverse effect of the process.

There have been reports saying that SIMOX can produce defective Si oxide regions in the Si oxide layer that are referred to as pipes. One of the possible causes of the phenomenon may be foreign objects such as dust introduced into the layer at the time of ion implantation. The device produced in a pipe region can show degraded characteristics due to the leak current between the active layer and the underlying substrate.

The SIMOX technique involves the use of a large volume of ions that is by far greater than the volume used in the ordinary semiconductor process and hence the ion implantation process may take a long time if a specifically designed apparatus is used for it. Since the ion implantation process is performed typically by means of raster scan of an ion beam showing a predetermined flow rate of electric current or by spreading an ion beam, a long time may be required for processing a large wafer. Additionally, when a large wafer is processed at high temperature, the slip problem due to an uneven temperature distribution within the wafer can become very serious. Since the SIMOX process requires the use of extraordinary high temperature that is as high as 1,320° C. which is not observed in the ordinary Si semiconductor process, the problem of uneven temperature distribution will become more serious if a large wafer has to be prepared unless a highly effective apparatus is not realized.

Beside the above described known techniques of forming SIO, a technique of bonding a single crystal Si substrate to another single crystal Si substrate that has been thermally oxized to produce an SOI structure has been proposed recently. This method requires the use of an active layer having an even thickness for the devices to be formed on it. More specifically, a single crystal Si substrate that is as thick as several hundreds micrometers has to be made as thin as several micrometers or less. Three techniques have been known for thinning a single crystal Si layer that include;

(1) polishing,
(2) local plasma etching and
(3) selective etching.

It is difficult to achieve an even film thickness by means of the polishing technique of (1) above. Particularly, the mean deviation in the film thickness can be as large as tens of several percent to make the technique unfeasible when the film is thinned to an order of sub- micrometer. This problem will become more remarkable for wafers having a large diameter.

The technique of (2) is typically used in combination with that of (1). More specifically, the film is thinned by means of the technique of (1) to about 1 to 3 $\mu$m and the distribution of film thickness is determined by observing the film thickness at a number of points. Then, the film is subjected to an etching operation where the film is scanned with plasma of $SF_6$ particles having a diameter of several millimeters, correcting the distribution of film thickness, until a desired film thickness is obtained. There has been a report that the distribution of film thickness can be confined within about ±10 nm or less by means of this technique. However, this process is accompanied by a drawback that, if foreign objects are present on the substrate in the form of particles during the plasma etching, they operate as so many etching masks to produce projections on the substrate when the etching operation is over.

Additionally, since the substrate shows a coarse surface immediately after the etching operation, a touch- polishing operation has to be conducted on the surface after the end of the plasma etching and the operation is controlled only in terms of its duration. Then, again the problem of deviations in the film thickness due to polishing arises. Still additionally, a polishing agent typically containing colloidal silica is used for the polishing operation and hence the layer for making an active layer is directly scraped by the polishing agent so that a crushed and/or distorted layer may be produced. The throughput of the process can be significantly reduced when large wafers are treated because the duration of the plasma etching operation is prolonged as a function of the surface area of the wafer being processed.

The technique of (3) involves the use of a film configuration for the substrate to be thinned that comprises one or more than one film layers adapted to selective etching. For example, assume that a $P^+$-Si thin layer containing boron by more than $10^{19}/cm^3$ and a P-type Si thin layer are made to grow sequentially on a P-type substrate by means of epitaxial growth to produce a first substrate, which is then bonded to a second substrate with an insulation layer interposed therebetween, the insulation layer being typically an oxide film, and that the rear surface of the first substrate is made sufficiently thin in advance by scraping and polishing. Subsequently, the P+-layer is made to become exposed by selectively etching the overlying P-type layer and then the P-type substrate is made to become exposed by selectively etching the $P^+$-layer to produce an SOI structure. This technique is discussed in detail in a report by Maszara (W. P. Maszara, J. Electrochem. Soc., Vol. 138,341 (1991)).

While the selective etching technique is effective for producing a thin film with an even film thickness, it is accompanied by the drawbacks as identified below.

The selective etching ratio is not satisfactory and will be as low as $10^2$ at most.

A touch-polishing operation is required to smooth the surface after the etching operation because of the coarse surface produced by the etching operation. Therefore, the film thickness can lose the uniformity as it is reduced by polishing. Particularly, while the polishing operation is controlled by the duration of the operation, it is difficult to rigorously control the operation because the polishing rate can vary significantly from time to time. Thus, this problem becomes unnegligible when forming an extremely thin SOI layer that is as thin as 100 nm.

The produced SOI layer can show a poor crystallinity due to the use of a film forming technique that involve ion implantation and epitaxial or hetero-epitaxial growth on an Si layer that is densely doped with B. Additionally, the bonded surface of the substrate may show a degree of smoothness that is inferior relative to that of a conventional Si wafer (C. Harendt, et al., J. Elect. Mater. Vol. 20,267 (1991), H. Baumgart, et al., Extended Abstract of ECS 1st International Symposium of Wafer Bonding, pp-733 (1991), C. E. Hunt, Extended Abstract of ECS 1st International Symposium of Wafer Bonding, pp-696 (1991)). Still additionally, there is a problem that the selectivity of the selective etching technique heavily depends on the concentration difference among the impurities such as boron contained in the substrate and the steepness of the concentration profile of the impurities along the depth of the substrate. Therefore, if the bonding anneal is conducted at high temperature to improve the bonding strength of the layers and the epitaxial growth is carried out also at high temperature to enhance the crystallinity of the SOI layer, the concentration profile of the impurities along the depth becomes flattened to reduce the selectivity of the etching operation. Simply stated, the improvement of the etching selectivity and hence that of the crystallinity and the improvement of the bonding strength are conflicting requirements that cannot be met at the same time.

Under these circumstances, the inventors of the present invention proposed a novel method of manufacturing a semiconductor article in Japanese Patent Application Laid-Open No. 5-21338. According to the invention, the proposed method is characterized by comprising steps of forming an article by arranging a nonporous single crystal semiconductor region on a porous single crystal semiconductor region, bonding the surface of a material carrying an insulating material thereon to the corresponding surface of said porous single crystal semiconductor region and subsequently removing said porous single crystal semiconductor region by etching.

T. Yonehara et al. who are the inventors of the present invention also reported a bonded SOI that is excellent in terms of even film thickness and crystallinity and adapted to batch processing (T. Yonehara et al., Appl. Phys. Lett. Vol. 642,108 (1994)). Now, the proposed method of manufacturing a bonded SOI will be summarily described below by referring to FIGS. 4A through 4C of the accompanying drawings.

The proposed method uses a porous layer 32 formed on a first Si substrate 31 as a layer to be selectively etched. After forming a nonporous single crystal Si layer 33 on the porous layer 32 by epitaxial growth, it is bonded to a second substrate 34 with an Si oxide layer 35 interposed therebetween (FIG. 4A). Then, the porous Si layer is made to become exposed over the entire surface area of the first substrate by scraping off the first substrate from the rear side (FIG. 4B). The exposed porous Si is then etched out by means of a selective etching solution typically containing KOH or $HF+H_2O_2$ (FIG. 4C). Since the selective etching ratio of the operation of etching the porous Si layer relative to the bulk Si layer (nonporous single crystal Si layer) can be made as high as hundreds of thousands with this technique, the nonporous single crystal Si layer formed on the porous layer in advance can be transferred onto the second substrate to produce an SOI substrate without reducing the thickness of the nonporous single crystal Si layer. Thus, the uniformity of the film thickness of the SOI substrate is determined during the epitaxial growth step. According to a report by Sato et al., since a CVD system adapted to an ordinary semiconductor process can be used for the epitaxial growth, a degree of uniformity of the film thickness as high as 100 nm±2% can be realized. Additionally, the epitaxial Si layer shows an excellent crystallinity of about $3.5\times10^2/cm^2$.

Since the selectivity of any conventional selective etching technique heavily depends on the concentration difference among the impurities contained in the substrate and the steepness of the concentration profile of the impurities along the depth of the substrate as described above, the temperature of the heat treatment (for bonding, epitaxial growth, oxidation and so on) is limited to as low as 800° C. at most because the impurity concentration profile becomes flattened above that temperature limit. On the other hand, the etching rate of the proposed etching technique is mainly determined by the structural difference between the porous layer and the bulk layer so that the heat treatment is not subjected to such a rigorous limitation and temperature as high as 1,180° C. can be used. It is known that a heat treatment process conducted after the bonding operation can remarkably improve the bonding strength between wafers and reduce the size and number of voids given rise to on the bonding interface. Additionally, with a selective etching operation relying the structural difference between the porous layer and the bulk layer, the uniformity of the film thickness is not adversely affected by fine particles that can be adhering to the porous Si layer.

However, a semiconductor substrate to be produced by way of a bonding process inevitably requires at least two wafers as starting materials, one of which is substantially wasted away in the course of polishing and etching to consume the limited natural resources almost for nothing. In other words, an SOI manufacturing process is required to realize low cost and economic feasibility in addition to an enhanced degree of process controllability and an improved uniformity of the film thickness.

Differently stated, the requirements of a process for manufacturing a high quality SOI substrate include an excellent reproducibility, an enhanced level of resource saving capability through the repeated use of a same wafer and low manufacturing cost.

Under these circumstances, the inventors of the present invention proposed in Japanese Patent Application Laid-Open No. 7-302889 a method of manufacturing a semiconductor substrate, with which a pair of substrates are bonded together and subsequently separated from each other through a porous layer arranged therebetween so that one of the substrates may be reused by removing the porous substance remaining on it. The disclosed method will now be summarily described below by referring to FIGS. 5A through 5C of the accompanying drawings.

It comprises steps of forming a porous layer 42 by transforming a surface layer of a first Si substrate 41 into a porous state, forming a single crystal Si layer 43 on the porous layer, bonding the single crystal Si layer to the main surface of a second Si substrate 44 with an insulation layer 45 interposed therebetween (FIG. 5A). It further comprises steps of separating the wafers bonded together with the porous layer arranged therebetween (FIG. 5B) and selectively removing the exposed porous Si layer on the surface of the second Si substrate to produce an SOI substrate (FIG. 5C). With this method, the first substrate 41 can be reused after removing the residual porous layer. The bonded wafers may be separated from each other typically by way of one of the following techniques;

applying sufficiently strong tensile force or pressure onto a surface of the combined wafers along a direction perpendicular to the surface;

applying wave energy in the form of an ultrasonic wave or the like to the combined wafers;

causing the porous layer to be exposed at an end surface of the combined wafers, etching the porous Si layer to a certain extent and inserting the edge of a blade;

causing the porous layer to be fully exposed at an end surface of the wafers, soaking the porous Si layer with liquid that may be water and causing the liquid to expand by entirely heating or cooling the combined wafers; and applying force to the first (or second) substrate along a direction parallel to the second (or first) substrate in order to destroy the porous Si layer.

The above listed techniques are based on the idea that, while the mechanical strength of the porous Si layer depends on the porosity of the layer, it is sufficiently lower than that of a bulk Si layer. As a rule of thumb, a porous Si layer having a porosity of 50% shows a mechanical strength about a half of that of a corresponding bulk Si layer. In short, when a pair of bonded wafers is subjected to compressive, tensile or shearing force, the porous Si layer will be destroyed to begin with. A porous layer showing a higher degree of porosity can be destroyed with less force.

However, in reality, efforts have been paid to reduce the porosity of the surface layer of the porous Si in order to realize an excellent epitaxial growth in terms of the quality of the device formed on the SOI substrate, while increasing the porosity of the inside of the porous Si for easy separation of the bonded wafers. Thus, as described in an example disclosed in Japanese Patent Application Laid-Open No. 7-302889, it has been a known practice to modify the porosity of the porous Si layer by controlling the electric current used in an anodization process.

On the other hand, the above identified Japanese Patent Application Laid-Open No. 7-302889 discloses that a substrate that has been used for preparing a semiconductor substrate can be reused for preparing another semiconductor substrate and hence it provides a very useful technique for reducing the cost of manufacturing semiconductor substrates.

More specifically, Japanese Patent Application Laid-Open No. 7-302889 discloses a technique that uses anodization for transforming a silicon substrate into a porous state. In a plant where a large number of silicon substrates have to be uniformly transformed into a porous state, the specific resistance of the substrate has to be rigorously controlled because an anodization process utilizes an anodic reaction of silicon. However, a silicon substrate showing a specified specific resistance is costly and hence the cost of manufacturing an SOI substrate can be significantly reduced if it can prepared disregarding its specific resistance.

SUMMARY OF THE INVENTION

In view of the above described circumstances, it is therefore an object of the present invention to provide a method of manufacturing a semiconductor article comprising a step of bonding a pair of substrates, wherein part of the substrates is reused as raw material for manufacturing another semiconductor article.

Another object of the present invention is to provide a method of manufacturing a semiconductor article, characterized by comprising steps of forming a diffusion region at least on the surface of one of the sides of a silicon substrate by diffusing an element capable of controlling the conduction type, forming a porous silicon layer in a region including said diffusion region, preparing a first substrate by forming a nonporous semiconductor layer on said porous silicon layer, bonding said first substrate and a second substrate together to produce a multilayer structure with said nonporous semiconductor layer located inside, splitting said multilayer structure along said porous silicon layer but not along said diffusion region and removing the porous silicon layer remaining on said split second substrate.

Still another object of the present invention is to provide a method of manufacturing a semiconductor article, characterized by comprising steps of forming a diffusion region at least on the surface of one of the sides of a silicon substrate by diffusing an element capable of controlling the conduction type, forming a porous silicon layer in a region including said diffusion region, preparing a first substrate by forming a nonporous semiconductor layer on said porous silicon layer, bonding said first substrate and a second substrate together to produce a multilayer structure with said nonporous semiconductor layer located inside, splitting said multilayer structure along said porous silicon layer but not along said diffusion region, removing the porous silicon layer remaining on said split second substrate and reusing the substrate obtained by removing the porous layer remaining on said separated first substrate as material of another first substrate.

A further object of the present invention is to provide a method of manufacturing a semiconductor article, characterized by comprising steps of forming a diffusion region at least on the surface of one of the sides of a silicon substrate by diffusing an element capable of controlling the conduction type, forming a porous silicon layer in a region including said diffusion region, preparing a first substrate by forming a nonporous semiconductor layer on said porous silicon layer, bonding said first substrate and a second substrate together to produce a multilayer structure with said nonporous semiconductor layer located inside, splitting said multilayer structure along said porous silicon layer but not along said diffusion region, removing the porous silicon layer remaining on said split second substrate and reusing the substrate obtained by removing the porous layer remaining on said separated first substrate as material of another second substrate.

With a method of manufacturing a semiconductor article according to the invention, after forming a diffusion region (high concentration impurity region) at least on the surface of one of the sides of a silicon substrate by diffusing an element capable of controlling conductivity, a porous silicon layer is formed in a region including said diffusion region. Thus, a desired value can be selected for the concentration of the element (impurity concentration as generally referred to in the field of the semiconductor industry) capable of controlling conductivity in the diffusion region that provides the basis of forming a porous silicon layer. In other words, a relatively low cost silicon wafer or a regenerated wafer that does not have a specified specific resistivity can be used for various applications where a silicon substrate having a specified specific resistivity is used ("a regenerated wafer" as used herein refers to a wafer obtained by polishing and removing the surface layer of a monitor wafer used in an IC process or a wafer carrying thereon one or more than one defective devices to such an extent that it can be reused in an IC process). Therefore, with a method of manufacturing a semiconductor article according to the invention, a semiconductor article can be manufactured at a cost by far lower than the cost of manufacturing it by means of any known manufacturing method. Additionally, the regions of the porous silicon layer other than the diffusion region are structurally by far more fragile than the diffusion region that is porous so that they can be destroyed very easily in the splitting process and the first and second substrates can be separated from each other easily and reliably. In other words, a fragile structure can be produced within the porous silicon layer without modifying the electric current in the course of the process of forming the porous silicon layer. Thus, a couple of porous silicon layers can be automatically and sequentially formed without changing the anodizing conditions so that the surface porous silicon layer may be used for forming a high quality epitaxial layer while the underlying porous silicon layer may effectively operate as separation layer.

A diffusion region can be formed on both the principal surface and the rear surface of a silicon substrate by means of a diffusion technique. With a silicon wafer carrying a diffusion region on both of its oppositely disposed surfaces, the electric resistance between the rear surface of the wafer and the + electrode can be reduced for forming a porous layer to a great advantage of causing a uniform current to flow along the surface of the wafer so that a porous silicon layer may be formed with a very uniform thickness. While a technique such as ion implantation or epitaxial growth may alternatively be used for forming a high concentration impurity region (particularly $P^+$ layer), unlike a diffusion technique, these techniques are effective only for treating only one of the oppositely disposed surfaces of a substrate and hence cannot be used to produce a $P^+$ layer of the rear surface of the substrate. Additionally, these techniques are costly if compared with a diffusion technique, although they can treat only one of the oppositely disposed surfaces of a substrate. Differently stated, a diffusion technique is advantageous in that it can treat both of the oppositely disposed surfaces of a substrate at relatively low cost.

Additionally, a method of manufacturing a semiconductor article according to the invention is effective in producing a highly crystalline single crystal semiconductor layer on a surface of a second substrate that may be made of an insulating substrate and, therefore, it operates excellently for manufacturing semiconductor articles in terms of productivity, uniformity, controllability and cost.

Finally, a semiconductor article manufactured by a method according to the invention is less costly and hence can effectively replace a costly SOS or SIMOX in the process of manufacturing a large scale integrated circuit having an SOI structure.

DETAILED DESCRIPTION OF THE PREFERRED EMBODIMENTS

Now, the present invention will be described in greater detail in terms of preferred modes and different phases of carrying out the invention. However, it will be appreciated that the present invention is by no means limited thereto and covers any other modes of realizing the invention that can be used for the purpose of the invention.

Preparation of a Diffusion Region

For the purpose of the present invention, an element adapted to being diffused into a silicon substrate by means of a diffusion technique and capable of controlling the conduction type refers to an element that is popularly used with a technique of processing a semiconductor material and can be selected from the elements listed in Table 1 below.

TABLE 1

| Elements Capable of Controlling the Conduction Type | |
|---|---|
| conduction type | element |
| n | P, As, Sb |
| p | B |

The diffusion technique to be used for the purpose of the present invention is preferably adapted to thermally diffuse an element capable of controlling the conduction type into a silicon substrate. Diffusion techniques that can be used for the purpose of the present invention include those listed in Table 2 below.

TABLE 2

| Techniques for Diffusing an Element | | |
|---|---|---|
| diffusion technique | diffusion source | furnace |
| open pipe technique | $POCl_3$, BN, $PH_3$ | diffusion furnace |
| application technique | a piece of glass applied with the element | diffusion furnace |
| use of doped film | doped oxide (CVDPSG) doped poly-Si | diffusion furnace |
| sealed pipe technique | As (solid), $BCl_3$, $PH_3$ capsule | diffusion furnace |

For the purpose of the invention, a porous layer is formed within a diffusion region more easily when the diffusion region is a P-type diffusion region than when it is an N-type diffusion region. In view of this fact, techniques that can be used for diffusion B (boron) are listed in Table 3 below.

TABLE 3

| Boron Diffusion Techniques | |
|---|---|
| gaseous source | $B_2H_6$ |
| liquid source | $BBr_3$ |
| solid source | $B_2O_3$ |
| solid phase-solid phase diffusion | CVD film, BSG, spin-coated film |

With any of the techniques listed in Table 3, the element supplied from the source is diffused into a silicon substrate by means of a heat treatment operation conducted in a "furnace".

For example, the diffusion technique using a spin-coated film is carried out in a manner as described below.

Figure 3:
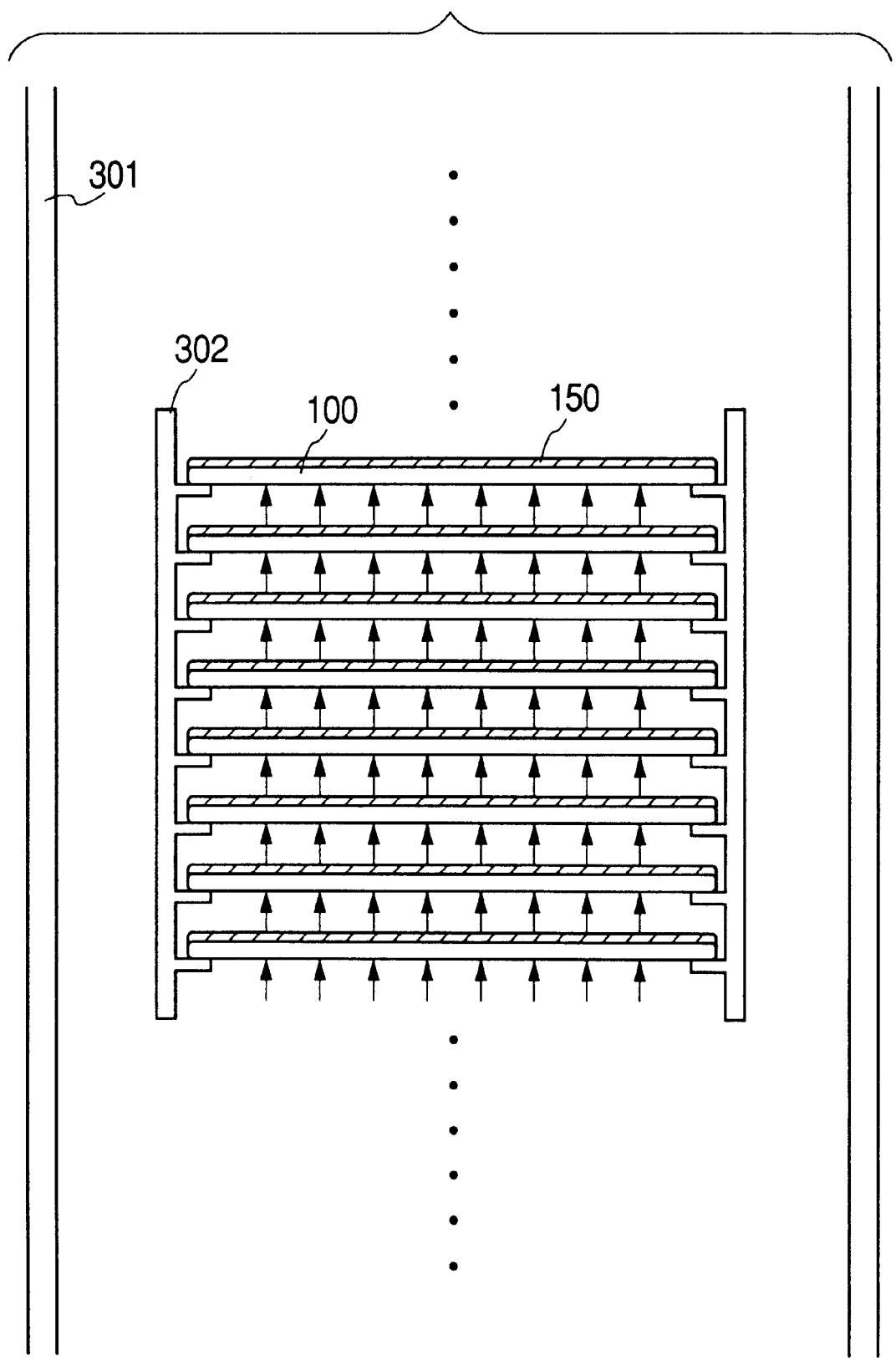
FIG. 3 is a schematic cross sectional view of a furnace that can be used for forming a diffusion region for the purpose of the invention.

Firstly, a mixture of $B_2O_3$, an organic binder and a solvent is evenly applied onto a silicon substrate (wafer) by means of a spinner. The applied mixture is dried and baked to form a $B_2O_3$ film on the silicon substrate. Thereafter, the silicon substrate is placed in a furnace having a configuration as shown in FIG. 3 and subjected to a heat treatment process, where boron (B) atoms are diffused into the substrate. In FIG. 3, reference numeral 301 denotes the furnace and reference numeral 302 denotes a susceptor. The silicon substrate 100 is coated on one of the surfaces thereof with a $B_2O_3$ film. Thus, boron (B) atoms can be diffused into the silicon substrate by heating the substrate at 900 to 1,300° C. in the furnace. Note that a diffusion region is formed not only on the surface that carries thereon the $B_2O_3$ film but also on the oppositely disposed surface of the substrate when another silicon substrate carrying thereon a $B_2O_3$ film is arranged within the furnace with the $B_2O_3$ film carrying surface located vis-a-vis the surface of the first substrate carrying no $B_2O_3$ film thereon because the $B_2O_3$ film of the second substrate operates as a source for supplying $B_2O_3$.

A diffusion layer is formed on both of the oppositely disposed surfaces of the silicon substrate is advantageous because it can reduce the contact resistance between the substrate and the HF solution that is used in the anodization process for forming a porous silicon layer in the diffusion region.

For the purpose of the invention, the concentration of the element contained in the diffusion region and capable of controlling the conduction type is generally between 5.0× $10^{16}$/cm$^3$ and 5.0×$10^{20}$/cm$^3$, preferably between 10×$10^{17}$/cm$^3$ and 2.0×$10^{20}$/cm$^3$ and most preferably between 5.0× $10^{17}$/cm$^3$ and 10×$10^{20}$/cm$^3$ from the viewpoint of the process of producing porous silicon through transformation and the characteristics of the epitaxial film formed on the porous silicon layer.

For the purpose of the invention, the thickness of the diffusion region is controllable by controlling the temperature and the duration of the heat treatment process. It is generally between 100 Å and 100 μm, preferably between 500 Å and 50 μm and most preferably between 5,000 Å and 30 μm. However, it is not necessarily required to form a thick diffusion region because the process of transforming it into a porous state that follows the process of forming the diffusion region can easily spread beyond the diffusion region.

For the purpose of the present invention, basically any single crystal silicon substrate (silicon wafer) can be used for the silicon substrate on which a diffusion region is formed. However, from the viewpoint of manufacturing a semiconductor substrate at low cost, a silicon substrate having an unspecified electric resistance, a monitor wafer that has been used in an IC process or a regenerated wafer obtained by polishing the surface layer of a substrate carrying thereon one or more than one defective devices to such an extent that it may be reused for an IC process may advantageously be used for the purpose of the invention.

Preparation of Porous Silicon

Porous Si was firstly discovered in 1956 by Uhlir et al. who were studying a process of electropolishing a semiconductor material (A. Uhlir, Bell Syst. Tech. J., Vol. 35,333 (1956)). Porous Si can be prepared through anodization of an Si substrate in an HF solution. Unagami reports as a result of his study on the dissolutive reaction of Si in an Si anodization process that the existence of holes is required for anodization of Si and the reaction proceeds in a manner as described below (T. Unagami, J. Electrochem. Soc., Vol. 127,476 (1980)).

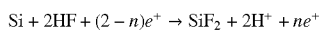

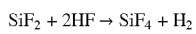

or

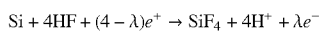

where $e^+$ and $e^-$ represent respectively a hole and an electron and n and λ represent respective numbers of holes required for dissolving a single Si atom. The report says that porous Si is formed when the condition of n>2 or λ>4 is met.

Although a conclusion that can be drawn from the above is that P-type Si can be made porous under the existence of holes whereas N-type Si cannot be made porous, in reality, both N-type Si and P-type Ni can be turned porous under certain conditions.

According to the invention, single crystal porous Si can be formed through anodization of a single crystal Si substrate typically in an HF solution. A porous Si layer shows a spongy structure where pores with a diameter between $10^{-1}$ and 10 nm are arranged with intervals between $10^{-1}$ and 10 nm. The density of porous Si can be made to vary between 2.1 and 0.6 g/cm$^3$ by varying the concentration of the HF solution between 50 and 20% and/or by varying the current density in contrast to the density of single crystal Si that is equal to 2.33 g/cm$^3$. In other words, the porosity of porous Si is variable. While porous Si can be made to show a density less than a half of that of single crystal Si, it maintains the properties as single crystal Si so that a single crystal Si layer can be formed by epitaxial growth on a porous Si layer.

A porous Si layer has a density that is less than the density of a single crystal Si layer because it contains a large number of voids in the inside. Consequently, a porous Si layer shows a dramatically large surface area relative to the volume it occupies. This means that a porous Si layer can be etched at a rate by far greater than the rate at which an ordinary single crystal Si layer is normally etched.

While porous Si shows a mechanical strength that varies depending on its porosity, it is presumably lower than that of bulk Si. For instance, if a porous Si layer shows a porosity of 50%, it may be safe to assume that its mechanical strength is about a half of that of a comparable bulk Si layer. In other words, when a wafer formed by bonding a pair of substrates is subjected to compressive, tensile or shearing force, the porous Si layer arranged therebetween will be destroyed firstly. If the layer has a large porosity, it will be destroyed with little effort.

As pointed above under [Preparation of a Diffusion Region], the process of transforming a diffusion region into a porous state can easily spread beyond the diffusion region. For the purpose of the present invention, the thickness of the porous layer is generally between 1 and 150 μm, preferably between 2 and 80 μm and most preferably between 5 and 50 μm from the viewpoint of the time required for forming the porous layer and the desired level of fragility of the porous layer.

Nonporous Semiconductor Layer

For the purpose of the present invention, a nonporous semiconductor layer can be formed preferably by using a material selected from single crystal Si, polycrystalline Si, noncrystalline Si and compound semiconductors including GaAs, InP, GaAsP, GaAlAs, InAs, AlGaSb, InGaAs, ZnS, CdSe, CdTe and SiGe. A nonporous semiconductor layer that can be used for the purpose of the present invention may substantially contain one or more than one FETs (field effect transistors).

First Substrate

For the purpose of the present invention, the first substrate is a silicon substrate having therein a porous silicon layer and carrying a nonporous semiconductor layer arranged on the porous silicon layer. It may be prepared by forming a nonporous semiconductor layer on the porous silicon layer in the silicon substrate or by forming a porous silicon layer in part of a silicon substrate having therein a nonporous semiconductor substrate.

A nonporous semiconductor layer can be formed on a porous silicon layer typically by means of a CVD technique selected from vacuum CVD, plasma CVD, photo CVD and MO CVD (metal-organic CVD), a sputtering technique (including a bias sputtering technique), a molecular beam epitaxial growth technique or a liquid phase growth technique.

Second Substrate

For the purpose of the present invention, the second substrate onto which the nonporous semiconductor layer is transferred from the first substrate may be selected from a semiconductor substrate such as a single crystal silicon substrate, a semiconductor substrate carrying an insulation film such as an oxide film (including a thermally oxidized film) or a nitride film on the surface thereof, a light transmitting substrate such as a silica glass substrate or a glass substrate, a metal substrate and an insulating substrate typically made of alumina depending on the application of the finally prepared semiconductor article.

Bonding

For the purpose of the invention, the first substrate comprising a porous silicon layer and a nonporous semiconductor layer can be firmly bonded to a second substrates to produce a multilayer structure (in such a way that the nonporous semiconductor layer is located inside). For the purpose of the present invention, a multilayer structure having a nonporous semiconductor layer located inside refers not only to a structure obtained by bonding the nonporous semiconductor layer of a first substrate directly to a second substrate but also to a structure obtained by bonding the nonporous semiconductor layer of a first substrate carrying on the surface thereof an insulation film such as an oxide film, a nitride film or some other film to a second substrate. In other words, a multilayer structure having a nonporous semiconductor layer located inside refers to a structure where the nonporous semiconductor layer is located inside relative to the porous silicon layer.

For the purpose of the present invention, the first and second substrates can be firmly bonded together typically at room temperature by smoothing their bonding surfaces. Additionally, techniques including anodic bonding, pressurization and thermal treatment may appropriately be used to improve the bonding strength.

Splitting the Multilayer Structure

Since the porous silicon layer formed outside the diffusion region is fragile if compared with the porous silicon layer formed inside the diffusion region and hence can be easily destroyed in the process of separating the first and second substrates so that the two substrate can be separated reliably. Specific techniques that can be used for splitting the multilayer structure include application of external force that may be in the form of pressure, pulling force or shearing force, application of internal force by oxidizing and expanding the porous silicon, generation of thermal stress by applying pulsation of heat to the multilayer structure and simply softening the porous silicon layer as well as other appropriate techniques.

Removal of the Porous Layer

After separating the multilayer structure that has been prepared by bonding first and second substrates together along the porous Si layer, the residual porous Si remaining on the substrates can be selectively removed on the basis of the fact that the porous Si layer has a low mechanical strength and a large surface area. Methods that can be used for selectively removing the remaining porous Si include mechanical techniques such as scraping and polishing, chemical etching using an etching solution and ion etching (such as reactive ion etching).

Etching solutions that can be used for a process of selectively removing the porous Si by means of an etching solution include, beside a mixture solution of 49% hydrofluoric acid and 30% aqueous hydrogen peroxide, hydrofluoric acid, a mixture solution obtained by adding alcohol to hydrofluoric acid, a mixture solution obtained by adding alcohol and aqueous hydrogen peroxide to hydrofluoric acid, buffered hydrofluoric acid, a mixture solution obtained by adding alcohol to buffered hydrofluoric acid, a mixture solution obtained by adding aqueous hydrogen peroxide to buffered hydrofluoric acid, a mixture solution obtained by adding alcohol and aqueous hydrogen peroxide to buffered hydrofluoric acid and a mixture solution of hydrofluoric acid, nitric acid and acetic acid.

The semiconductor article having the transferred nonporous semiconductor layer may preferably be heat treated in a hydrogen-containing atmosphere, subsequently to the selective removal of the porous layer, to improve the flatness of the nonporous semiconductor layer.

Now, the present invention will be described by referring to the accompanying drawings that illustrate preferred modes of carrying out the invention.

First Mode of Carrying out the Invention

Figure 1A:
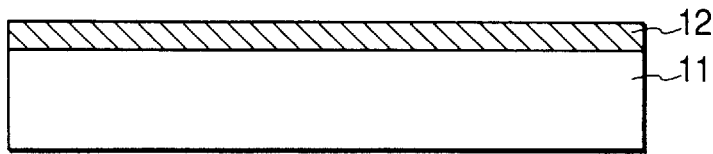
FIGS. 1A, 1B, 1C, 1D and 1E are schematic cross sectional lateral views of a semiconductor article being manufactured by a method according to the invention, illustrating different manufacturing steps in a mode of carrying out the invention.
Figure 1B:
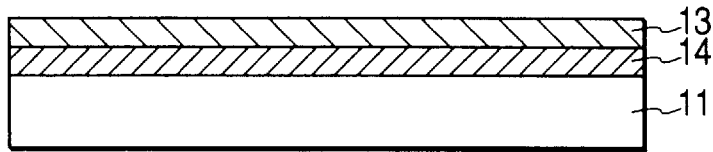
Figure 1C:
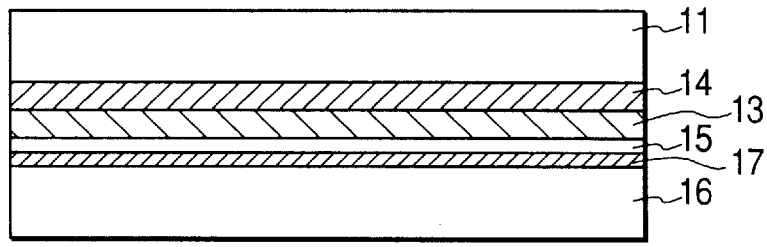

In this mode of carrying out the invention, a $P^+$ layer 12 is formed by diffusion on the principal surface of a single crystal silicon substrate 11 (FIG. 1A). Thereafter, the $P^+$ layer on the principal surface is transformed into a porous state to a depth greater than the thickness of the P+layer to produce a $P^+$ porous silicon layer 13 and an underlying porous silicon layer 14 (FIG. 1B). Then, at least a single nonporous thin film 15 is formed on the $P^+$ porous silicon layer 13. Now, a first substrate is prepared. The nonporous thin film 15 may comprise single crystal Si, polycrystalline Si, noncrystalline Si, metal film, compound semiconductor thin film or superconductive thin film. The bonding interface can be separated from the active layer preferably by additionally forming an uppermost $SiO_2$ layer. Referring to FIG. 1C, a surface of the second substrate 16 and a corresponding surface of the first substrate are brought into close contact so that they may be bonded together to produce a multilayer structure having the nonporous thin film 15 is located inside. Subsequently, the bonding strength between the two substrates can be increased by means of anodic bonding, pressurization, heat treatment, if appropriate, or a combination of any of these.

When a single crystal Si layer is produced by deposition, preferably silicon oxide is formed on the surface of the single crystal Si layer typically by thermal oxidation before the substrates are bonded together. The second substrate may be any of the above listed candidates. While FIG. 1C shows a second substrate bonded to a first substrate with an insulation layer 17 arranged therebetween, the insulation layer 17 may be omitted when the nonporous thin film 15 or the second substrate is not made of Si. A thin insulating panel may be arranged between the first and second substrates when bonding them together.

When the nonporous thin film is made of epitaxially grown single crystal silicon or some other similar material, the pores inside the porous Si layer can be rearranged and closed to reduce the etchability of the porous Si layer at the time of etching if it is subjected to heat treatment during the process of epitaxial growth or in a subsequent process. In order to avoid this problem and improve the structural stability of the porous layer, the porous Si layer is preferably subjected to a preliminary heat treatment operation that is conducted at temperature between 200 and 700° C. to form a thin oxide film on the wall surface of the pores (while maintaining the properties of porous single crystal silicon) and prevent any possible rearrangement of the pores.

A step as will be described below can be employed to produce an epitaxial silicon film that is substantially free from defects.

While a porous Si layer maintains the structure of single crystal silicon, the epitaxial silicon film formed on the surface can show defects attributable to the numerous pores existing on the surface of the porous Si layer. Therefore, it may be a good idea to hermetically close the surface of the porous Si layer that is brought into contact with the epitaxial film by means of single crystal Si.

A technique that can be used for hermetically closing the surface of the porous Si layer is a heat treatment operation to be conducted in a hydrogen-containing atmosphere. As a result of this heat treatment using hydrogen, some of the silicon atoms on the surface of the porous Si layer will be migrated to hermetically close the pores exposed to the surface of the porous Si layer. This heat treatment operation is typically conducted at temperature between 500 and 1,300° C., preferably between 900 and 1,300° C.

Apart from this technique, it may also be effective to form a silicon film on the surface of the porous Si layer at a very low rate to close the pores exposed to the surface of the layer by allowing gas that contains silicon atoms to flow into the film forming chamber.

In the above described process of closing the pores exposed to the surface of the porous Si layer and forming a silicon film by epitaxial growth after the formation of a thin oxide film on the wall surface of the pores, the single crystal is preferably exposed at the top of the porous Si layer to effectively close the pores. The single crystal can be exposed by immersing the upper surface of the porous Si layer whose pores have been coated with thin oxide film in an acid such as HF to remove the thin oxide film arranged on the upper surface.

Figure 1D:
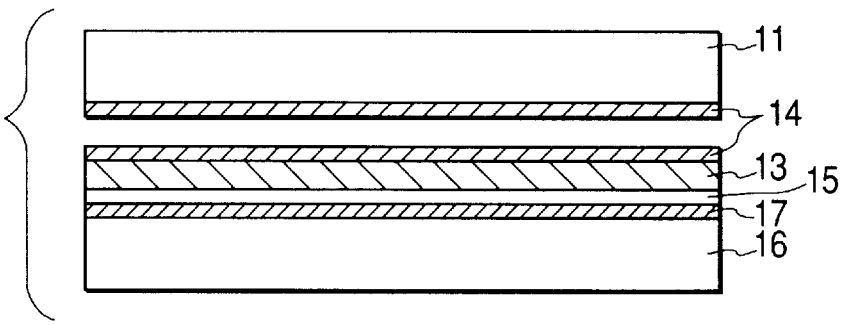

Thereafter, the two substrates are separated along the porous silicon layer 14 (FIG. 1D). Any of the above described techniques may be used for separating the substrates.

While the two substrates may be separated mainly along the fragile underlying porous silicon layer 14, they may partly or totally be separated through the $P^+$ porous silicon layer 13 without any problem.

Thereafter, the porous Si layers 13 and 14 are selectively removed. If the nonporous thin film is made of single crystal Si, only the porous Si layers 13 and 14 are etched off by nonelectrolytic wet chemical etching by using an etching solution prepared for ordinary Si etching, hydrofluoric acid that is an etching solution for selectively etching porous Si, a mixture solution obtained by adding at least either alcohol or aqueous hydrogen peroxide to hydrofluoric acid, buffered hydrofluoric acid or a mixture solution obtained by adding at least either ethanol or aqueous hydrogen peroxide to buffered hydrofluoric acid to leave the film that has been formed on the first substrate in advance on the second substrate. As described above in detail, it is possible to selectively etch only the porous Si by means of an etching solution prepared for ordinary Si etching because of the large surface area of the porous Si layers 13 and 14. Alternatively, the porous Si layers 13 and 14 may be selectively removed by polishing it, using the nonporous thin film layer 15 as a polishing stopper.

When a compound semiconductor layer is formed on the porous Si layer, an etching solution that provides a high Si etching rate relative to the compound semiconductor is used to chemically etch only the porous Si layers 13 and 14, leaving the thin single crystal compound semiconductor film layer 15 on the second substrate 16. Alternatively, the porous Si layers 13 and 14 may be selectively removed by polishing it, using the single crystal compound semiconductor layer 15 as a polishing stopper.

Figure 1E:
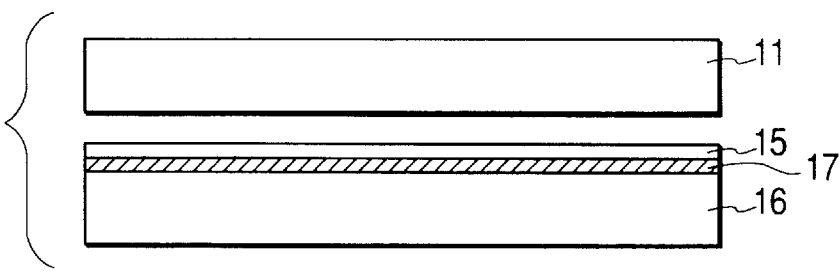

FIG. 1E shows a semiconductor article that can be produced by a method according to the invention. A large nonporous thin film which is typically a single crystal Si thin film 15 is evenly and thinly formed on the entire surface of the second substrate 16. If an insulating substrate is used for the second substrate 16, the prepared semiconductor substrate can advantageously be used for producing electronic devices that are insulated and separated from each other.

Once the residual porous Si on the first single crystal Si substrate 11 is removed from the latter, the latter can be used as another first single crystal Si substrate 11 or as another second substrate 16 after smoothing the surface if the surface has turned impermissibly coarse and such a smoothing operation is necessary.

Second Mode of Carrying Out the Invention

Figure 2A:
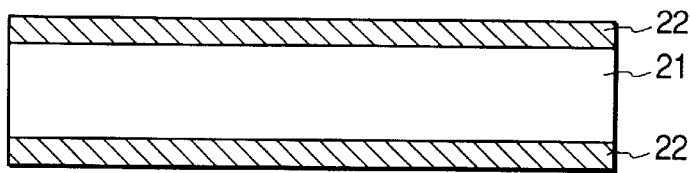
FIGS. 2A, 2B, 2C, 2D and 2E are schematic cross sectional lateral views of a semiconductor article being manufactured by a method according to the invention, illustrating different manufacturing steps in another mode of carrying out the invention.
Figure 2B:
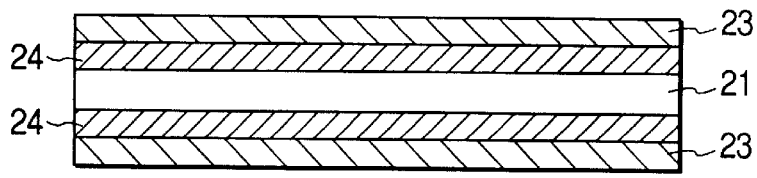
Figure 2C:
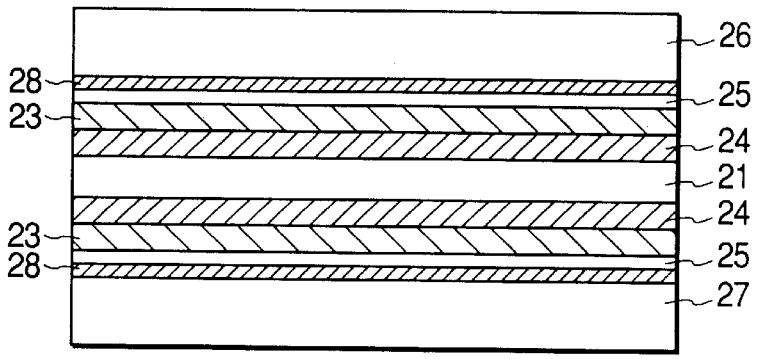
Figure 2D:
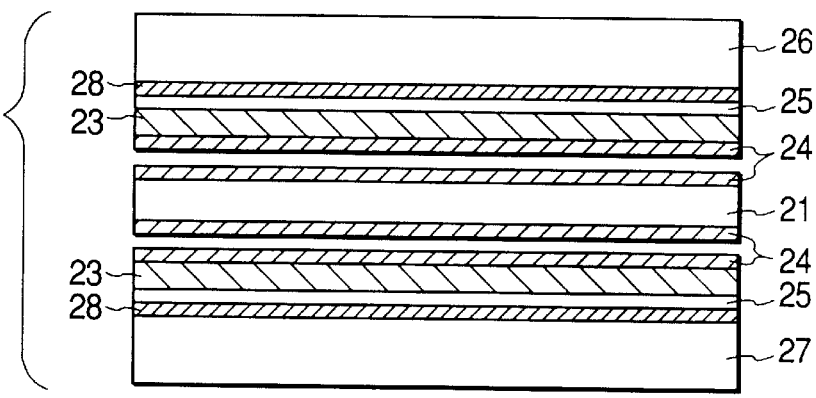
Figure 2E:
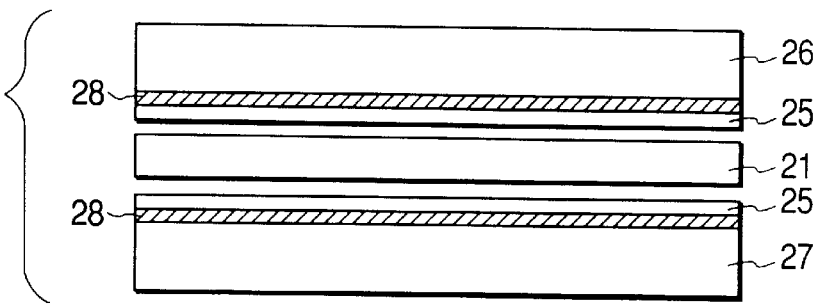

FIGS. 2A through 2E illustrate a second mode of carrying out the invention. As shown, a $P^+$ layer 22 is formed on each of the oppositely disposed surfaces of a single crystal silicon substrate 21 that constitutes a first substrate by means of a diffusion technique (FIG. 2A). Then, the first substrate is transformed into a porous state on the both sides to a depth greater than the thickness of the $P^+$ layers 22 to produce $P^+$ porous layers 23 and an underlying porous silicon layer 24 (FIG. 2B). Subsequently, a nonporous thin film 25 is formed on each $P^+$ porous layer 23 and then second substrates 26 and 27 are bonded to the respective sides with an insulation layer 28 disposed therebetween (FIG. 2C). Thus, it will be appreciated that a pair of semiconductor articles are prepared in a single process. Otherwise, the manufacturing steps of this mode are identical with those of the above described first mode.

Once the residual porous Si on the single crystal Si substrate 21 is removed from the latter, the latter can be used as another first single crystal Si substrate 21 or as another second substrate 26 (or 27) after smoothing the surface if the surface has turned impermissibly coarse and such a smoothing operation is necessary.

The support substrates 26, 27 may have respective thicknesses that are different from each other. The nonporous thin films 25 on the opposite surfaces of the first substrate may be made of respective materials and have respective thicknesses that are different from each other.

Now, the present invention will be described further by way of examples.

EXAMPLE 1

A 5 μm thick $P^+$ high concentration layer was formed as a surface layer of a single crystal silicon substrate having an unspecified electric resistance by means of a diffusion technique. Another $P^+$ high concentration layer was also formed on the rear surface of the substrate.

More specifically, the $P^+$ high concentration layer was formed in the following manner. A solution prepared by dissolving $B_2O_3$ into a solvent was applied to the principal surface of an Si substrate by means of a spin-coating technique, which was then baked at 140° C. to dissipate the solvent. The resultant substrate was then placed in a diffusion furnace and subjected to a so-called driven-in diffusion process to produce a $P^+$ high concentration layer, maintaining the temperature of the furnace tube to 1,200° C. for six hours. The spin-coated film was removed.

Subsequently, the Si substrate carrying thereon a $P^+$ high concentration layer was immersed in an HF solution to carry out an anodization process from the first surface side of the substrate and produce a porous layer on the first surface side. The anodization was conducted under the following conditions.

current density: 7 (mA·cm$^{-2}$)
anodization solution: $HF:H_2O:C_2H_5OH=1:1:1$
duration: 11 (min.)
thickness of the porous Si layer: 12 ($\mu$m)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 $\mu$m/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) carrying a 500 nm thick $SiO_2$ layer thereon and prepared in advance were brought into contact with each other and put together to produce a multilayer structure. The 100 nm thick $SiO_2$ layer and the epitaxial Si layer were removed by etching from an edge of the bonded wafer to expose an edge of the porous silicon layer.

Subsequently, the bonded wafer was subjected to pyro-oxidation at 1,000° C. to completely separate the two substrate along the lower porous silicon layer within 50 minutes. The separated surfaces were observed to find out that the porous silicon had been transformed into $SiO_2$ on the outer periphery of the wafer, while it remained unaffected in a central area.

Thereafter, the porous Si layer and the oxidized porous Si layer remaining on the second substrate were selectively etched off in a mixture solution of 49% hydrofluoric acid and 30% aqueous hydrogen peroxide, stirring the solution constantly. The single crystal Si was left unetched and operated as etching stopper so that the porous Si and the oxidized porous Si were selectively etched and removed completely.

The rate of etching nonporous single crystal Si by means of the above cited etching solution is very low and the selectivity ratio of the rate of etching porous Si relative to that of etching nonporous single crystal Si is as large as more than $10^5$ so that the reduction by etching of the height of the nonporous layer (about tens of several angstroms) is practically negligible.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the root mean square of surface roughness (Rrms) within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si and the oxidized porous silicon remaining on the first substrate were also selectively etched off in a mixture solution of 49% hydrofluoric acid and 30% aqueous hydrogen peroxide, stirring the solution constantly. The single crystal Si was left unetched and operated as etching stopper so that the porous Si and the oxidized porous Si were selectively etched and removed completely and the first substrate could be used for another diffusion process of the high concentration P+layer as another first substrate or for another oxide film forming process as a second substrate.

EXAMPLE 2

A 5 $\mu$m thick P$^+$ high concentration layer was formed as a surface layer of a single crystal silicon substrate having an unspecified electric resistance by means of a diffusion technique as in the case of Example 1. Another P$^+$ high concentration layer was also formed on the rear surface of the substrate. The high concentration surface layer of the single crystal Si substrate was subjected to anodization in an HF solution. The anodization was conducted under the following conditions.

current density: 7 (mA·cm$^{-2}$)
anodization solution: $HF:H_2O:C_2H_5OH=1:1:1$
duration: 11 (min.)
thickness of the porous Si layer: 12 ($\mu$m)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 $\mu$m/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) carrying a 500 nm thick $SiO_2$ layer thereon and prepared in advance were brought into contact with each other and put together.

After removing the oxide film on the rear surface of the Si substrate, a $CO_2$ laser beam was irradiated on the entire Si substrate side surface of the wafer with an output power level of 500 to 1,000W. The $CO_2$ laser was absorbed by the 500 nm thick $SiO_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 µm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 µm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration P$^+$ layer as another first substrate or for another oxide film forming process as a second substrate.

EXAMPLE 3

A 5 µm thick P$^+$ high concentration layer was formed as a surface layer of a single crystal silicon substrate having an unspecified electric resistance by means of a diffusion technique. Another P$^+$ high concentration layer was also formed on the rear surface of the substrate.

More specifically, the P$^+$ high concentration layer was formed by means of a diffusion technique in the following manner. An Si substrate was placed in a diffusion furnace and then $N_2$ gas was introduced into a liquid diffusion source containing $BBr_3$ for bubbling. The produced gas was then introduced into the furnace tube with a mixture carrier gas of ($N_2+O_2$). A $B_2O_3$ layer was formed by maintaining the temperature of the furnace tube to 1,050° C. for an hour and subsequently the substrate was subjected to a so-called driven-in diffusion process to produce a P$^+$ high concentration layer, maintaining the temperature of the furnace tube to 1,200° C. for six hours.

Then, the high concentration surface layer of the single crystal Si substrate was subjected to anodization in an HF solution. The anodization was conducted under the following conditions.

current density: 7 (mA·cm$^{-2}$)
anodization solution: HF:H$_2$O:C$_2$H$_5$OH=1:1:1
duration: 11 (min.)
thickness of the porous Si layer: 12 (µm)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 µm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 µm/min.

Additionally, an SiO$_2$ layer was formed to a thickness of 100 nm by thermally oxidizing the surface of the epitaxially grown Si layer.

The surface of the SiO$_2$ layer and the corresponding surface of an Si substrate (second substrate) carrying a 500 nm thick SiO$_2$ layer thereon and prepared in advance were brought into contact with each other and put together.

A pulsated electric current of about 10 to 100A was made to flow only through the high concentration P$^+$ single crystal Si layer of the first substrate. The electric current was made to flow by removing the SiO$_2$ to expose the high concentration P$^+$ single crystal Si layer at an end surface of the wafer and pinching the wafer by means of + and − electrodes that touch only the end surface. As a result, the underlying porous Si layer was abruptly subjected to thermal stress to sever the two substrates along the underlying porous Si layer.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 µm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 µm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration P$^+$ layer as another first substrate or for another oxide film forming process as a second substrate.

EXAMPLE 4

A 5 µm thick P$^+$ high concentration first layer was formed as a surface layer of a single crystal silicon substrate having an unspecified electric resistance by means of a diffusion technique as in the case of Example 3. Another $P^+$ high concentration layer was also formed on the rear surface of the substrate. The high concentration surface layer of the single crystal Si substrate was subjected to anodization in an HF solution. The anodization was conducted under the following conditions.

current density: 7 $(mA \cdot cm^{-2})$
anodization solution: $HF:H_2O:C_2H_5OH=1:1:1$
duration: 11 (min.)
thickness of the porous Si layer: 12 ($\mu$m)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 $\mu$m/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) carrying a 500 nm thick $SiO_2$ layer thereon and prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration $P^+$ layer as another first substrate or for another oxide film forming process as a second substrate.

EXAMPLE 5

A 5 $\mu$m thick $P^+$ high concentration layer was formed as a surface layer of a single crystal silicon substrate having an unspecified electric resistance by means of a diffusion technique as in the case of Example 1. Another $P^+$ high concentration layer was also formed on the rear surface of the substrate. The high concentration surface layer of the single crystal Si substrate was subjected to anodization in an HF solution. The anodization was conducted under the following conditions.

current density: 7 $(mA \cdot cm^{-2})$
anodization solution: $HF:H_2O:C_2H_5OH=1:1:1$
duration: 11 (min.)
thickness of the porous Si layer: 12 ($\mu$m)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 $\mu$m/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) carrying a 500 nm thick $SiO_2$ layer thereon and prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Then, the porous Si remaining on the second substrate was also selectively and completely eteched in an $HF/HNO_3/CH_3COOH$ type etching solution. The single crystal Si was left unetched and operated as etching stopper so that the porous Si was selectively etched and removed completely.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in an etching solution of $HF/HNO_3/CH_3COOH$ type, stirring the solution constantly. The single crystal Si was left unetched and operated as etching stopper so that the porous Si was selectively etched and removed completely and the. first substrate could be used for another diffusion process of the high concentration $P^+$ layer as another first substrate or for another oxide film forming process as a second substrate.

EXAMPLE 6

A 5 $\mu$m thick $P^+$ high concentration layer was formed as a surface layer of a single crystal silicon substrate having an unspecified electric resistance by means of a diffusion technique as in the case of Example 1. Another $P^+$ high concentration layer was also formed on the rear surface of the substrate. The high concentration surface layer of the single crystal Si substrate was subjected to anodization in an HF solution. The anodization was conducted under the following conditions.

current density: 7 (mA·cm$^{-2}$)

anodization solution: $HF:H_2O:C_2H_5OH=1:1:1$ duration: 11 (min.)

thickness of the porous Si layer: 12 ($\mu$m)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$ gas flow rate: 0.5/180 l/min.

gas pressure: 80 Torr temperature: 950° C.

growth rate: 0.3 $\mu$m/min.

Additionally, an $SiO_2$ layer was formed to a thickness of 100 nm by thermally oxidizing the surface of the epitaxially grown Si layer.

The surface of the $SiO_2$ layer and the corresponding surface of a quartz substrate (second substrate) prepared in advance were exposed to nitrogen plasma and then put together to bring them into contact with each other. The combined substrates were then annealed at 200° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 $\mu$m on the quartz substrate. The thickness of the formed single crystal Si layer was observed at 100 points spreading over the entire surface of the substrate to find that the uniformity of the film thickness was 101 nm±3 nm.

Then, the substrate was subjected to a heat treatment operation at 970° C. for two hours in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration $P^+$ layer as another first substrate.

EXAMPLE 7

A 5 $\mu$m thick $P^+$ high concentration first layer was formed as a surface layer of a single crystal silicon substrate having an unspecified electric resistance by means of a diffusion technique as in the case of Example 3. Another $P^+$ high concentration layer was also formed on the rear surface of the substrate. The high concentration surface layer of the single crystal Si substrate was subjected to anodization in an HF solution. The anodization was conducted under the following conditions.

current density: 7 (mA·cm$^{-2}$)

anodization solution: $HF:H_2O:C_2H_5OH=1:1:1$ duration: 11 (min.)

thickness of the porous Si layer: 12 ($\mu$m)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.55 µm on the porous Si layer by means of a CVD (chemical vapor deposition) technique. This operation was conducted under the following conditions.

source gas: $SiH_2Cl_2/H_2$ gas flow rate: 0.5/180 l/min.

gas pressure: 80 Torr temperature: 950° C.

growth rate: 0.3 µm/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) carrying a 500 nm thick $SiO_2$ layer thereon and prepared in advance were brought into contact with each other and put together. Thereafter, the 100 nm thick $SiO_2$ layer and the epitaxial Si layer were removed by etching from an edge of the bonded wafer to exposes an end of the porous silicon layer.

Subsequently, the bonded wafer was subjected to pyrooxidation at 1,000° C. to completely separate the two substrate along the lower porous silicon layer within 50 minutes. The separated surfaces were observed to find out that the porous silicon had been transformed into $SiO_2$ on the outer periphery of the wafer, while it remained unaffected in a central area.

Thereafter, the porous Si layer and the oxidized porous Si layer remaining on the second substrate were selectively etched off in a mixture solution of 49% hydrofluoric acid and 30% aqueous hydrogen peroxide, stirring the solution constantly. The single crystal Si was left unetched and operated as etching stopper so that the porous Si and the oxidized porous Si were selectively etched and removed completely.

The rate of etching nonporous single crystal Si by means of the above cited etching solution is very low and the selectivity ratio of the rate of etching porous Si relative to that of etching nonporous single crystal Si is as large as more than $10^5$ so that the reduction by etching of the height of the nonporous layer (about tens of several angstroms) is practically negligible.

Thus, a single crystal Si layer was formed to a thickness of 0.5 µm on the silicon oxide film. The thickness of the formed single crystal Si layer was observed at 100 points spreading over the entire surface of the substrate to find that the uniformity of the film thickness was 500 nm±15 nm.

Then, the substrate was subjected to a heat treatment operation at 1,100° C. for an hour in a hydrogen atmosphere. The surface coarseness was observed by means of atomic force microscopy to find that the Rrms within a 50 µm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si and the oxidized porous silicon remaining on the first substrate were also selectively etched off in a mixture solution of 49% hydrofluoric acid and 30% aqueous hydrogen peroxide, stirring the solution constantly. The single crystal Si was left unetched and operated as etching stopper so that the porous Si and the oxidized porous Si were selectively etched and removed completely and the first substrate could be used for another diffusion process of the high concentration $P^+$ layer as another first substrate or for another oxide film forming process as a second substrate.

EXAMPLE 8

A 5 µm thick $P^+$ high concentration layer was formed as a surface layer of a single crystal silicon substrate of a regenerated wafer by means of a diffusion technique as in the case of Example 3. Another $P^+$ high concentration layer was also formed on the rear surface of the substrate. The high concentration surface layer of the single crystal Si substrate was subjected to anodization in an HF solution. The anodization was conducted under the following conditions.

current density: 7 ($mA \cdot cm^{-2}$)

anodization solution: $HF:H_2O:C_2H_5OH=1:1:1$ duration: 11 (min.)

thickness of the porous Si layer: 12 (µm)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 µm on the porous Si layer by means of a CVD (chemical vapor deposition) technique. This operation was conducted under the following conditions.

source gas: $SiH_2Cl_2/H_2$ gas flow rate: 0.5/180 l/min.

gas pressure: 80 Torr temperature: 950° C.

growth rate: 0.3 µm/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) carrying a 500 nm thick $SiO_2$ layer thereon and prepared in advance were brought into contact with each other and put together.

After removing the oxide film on the rear surface of the Si substrate, a $CO_2$ laser beam was irradiated on the entire Si substrate side surface of the wafer with an output power level of 500 to 1,000W. The $CO_2$ laser was absorbed by the 500 nm thick $SiO_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration P$^+$ layer as another first substrate or for another oxide film forming process as a second substrate.

EXAMPLE 9

A 5 μm thick P$^+$ high concentration first layer was formed as a surface layer of a single crystal silicon substrate having an unspecified electric resistance by means of a diffusion technique as in the case of Example 1. Another P$^+$ high concentration layer was also formed on the rear surface of the substrate. The high concentration surface layer of the single crystal Si substrate was subjected to anodization in an HF solution. The anodization was conducted under the following conditions.

current density: 7 (mA·cm$^{-2}$)
anodization solution: HF:H$_2$O:C$_2$H$_5$OH=1:1:1
duration: 11 (min.)
thickness of the porous Si layer: 12 (μm)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal GaAs was made to epitaxially grow to a thickness of 1 μm on the porous Si layer by means of a MOCVD (metal organic chemical vapor deposition) technique. This operation was conducted under the following conditions.

source gas: TMG/AsH$_3$/H$_2$
gas pressure: 80 Torr
temperature: 700° C.

The surface of the GaAs layer and the corresponding surface of an Si substrate (second substrate) prepared in advance were brought into contact with each other and put together.

A pulsated electric current of about 10 to 100A was made to flow only through the high concentration P$^+$ single crystal Si layer of the first substrate. The electric current was made to flow by removing the SiO$_2$ to expose the high concentration P$^+$ single crystal Si layer at an end surface of the wafer and pinching the wafer by means of + and − electrodes that touch only the end surface. As a result, the underlying porous Si layer was abruptly subjected to thermal stress to sever the two substrates along the underlying porous Si layer.

Thereafter, the residual porous Si layer on the second substrate was etched off by means of:

ethylenediamine+pyrocatechol+water (at a ratio of 17 ml:3 g:8 ml) at 110° C.

The single crystal GaAs was left unetched and operated as etching stopper so that the porous Si and the oxidized porous Si was selectively etched and removed completely.

The rate of etching nonporous single crystal GaAs by means of the above cited etching solution is very low and the reduction by etching of the height of the nonporous layer (about tens of several angstroms) is practically negligible.

Thus, a single crystal GaAs layer was formed to a thickness of 1 μm on the silicon oxide film. The thickness of the formed single crystal GaAs layer was observed at 100 points spreading over the entire surface of the substrate to find that the degree of uniformity of the film thickness was 1 μm±29.8 nm.

When a cross section was observed through a transmission electron microscope, it was confirmed that no new crystal defects had been introduced in the GaAs layer and an excellent degree of crystallinity had been maintained.

For the purpose of comparison, a GaAs layer was formed on an insulation film by using an Si substrate carrying thereon an oxide film as support substrate to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration P$^+$ layer as another first substrate or for another bonding process as a second substrate.

EXAMPLE 10

A 5 μm thick P$^+$ high concentration layer was formed as a surface layer of a single crystal silicon substrate having an unspecified electric resistance by means of a diffusion technique as in the case of Example 1. Another P$^+$ high concentration layer was also formed on the rear surface of the substrate. The high concentration surface layer of the single crystal Si substrate was subjected to anodization in an HF solution. The anodization was conducted under the following conditions.

current density: 7 (mA·cm$^{-2}$)
anodization solution: HF:H$_2$O:C$_2$H$_5$OH=1:1:1
duration: 11 (min.)
thickness of the porous Si layer: 12 (μm)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film. Single crystal InP was made to epitaxially grow to a thickness of 1 μm on the porous Si layer by means of a MOCVD (metal organic chemical vapor deposition) technique.

The surface of the InP layer and that of a quartz substrate (second substrate) prepared in advance were brought into contact with each other and put together. The combined substrates were annealed at 200° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal InP was left unetched and operated as etching stopper so that the porous Si was selectively etched and removed completely.

Thus, a single crystal InP layer was formed to a thickness of 1 $\mu$m on the silicon oxide film. The thickness of the formed single crystal InP layer was observed at 100 points spreading over the entire surface of the substrate to find that the degree of uniformity of the film thickness was 1 $\mu$m±29.0 nm.

When a cross section was observed through a transmission electron microscope, it was confirmed that no new crystal defects had been introduced in the InP layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration P$^+$ layer as another first substrate.

EXAMPLE 11

A 5 $\mu$m thick P$^+$ high concentration first layer was formed as a surface layer on the two opposite sides of a double mirror single crystal silicon substrate having an unspecified electric resistance by means of a diffusion technique as in the case of Example 1. The high concentration surface layer of the single crystal Si substrate was subjected to anodization in an HF solution from the rear surface side. The anodization was conducted under the following conditions. The anodizing operation was conducted on one of the surfaces at a time for 11 minutes.

current density: 7 (mA·cm$^{-2}$)
anodization solution: HF:H$_2$O:C$_2$H$_5$OH=1:1:1
duration: 11×2 (min.)
thickness of the porous Si layer: 12 ($\mu$m)

Each of the obtained porous silicon layers had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on each of the porous Si layers by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 $\mu$m/min.

Additionally, an SiO$_2$ layer was formed to a thickness of 100 nm by thermally oxidizing the surface of each of the epitaxially grown Si layers.

The surface of each of the SiO$_2$ layers and the corresponding surface of an Si substrate (second substrate) carrying a 500 nm thick SiO$_2$ layer thereon and prepared in advance were brought into contact with each other and put together so that the first substrate was sandwiched by a pair of second substrates. Thereafter, the 100 nm thick SiO$_2$ layer and the epitaxial Si layer were removed by etching from an edge of the bonded wafer to exposes an end of the porous silicon layer.

Subsequently, the bonded wafer was subjected to pyrooxidation at 1,000° C. to completely separate the two substrate along the lower porous silicon layer within 50 minutes. The oxidation process is preferably conducted for several hours in order to minimize any deviations among wafers. The separated surfaces were observed to find out that the porous silicon had been transformed into SiO$_2$ on the outer periphery of the wafer, while it remained unaffected in a central area.

Thereafter, the porous Si layers and the oxidized porous Si layers remaining on the two second substrates were selectively etched off in a mixture solution of 49% hydrofluoric acid and 30% aqueous hydrogen peroxide, stirring the solution constantly. The single crystal Si was left unetched and operated as etching stopper so that the porous Si and the oxidized porous Si were selectively etched and removed completely.

Thus, a pair of 0.1 $\mu$m thick single crystal Si layers were formed on the silicon oxide film. The thickness of each of the formed single crystal Si layers was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si and the oxidized porous silicon remaining on the first substrate were also selectively etched off in a mixture solution of 49% hydrofluoric acid and 30% aqueous hydrogen peroxide, stirring the solution constantly. The single crystal Si was left unetched and operated as etching stopper so that the porous Si and the oxidized porous Si were selectively etched and removed completely and the first substrate could be used for another diffusion process of the high concentration P$^+$ layer as another first substrate or for another oxide film forming process as a second substrate.

EXAMPLE 12

A 10 $\mu$m thick P$^+$ high concentration first layer was formed as a surface layer of a single crystal silicon substrate having an unspecified electric resistance by means of a diffusion technique as in the case of Example 1 except that the drive-in diffusion process was conducted for 10 hours. Another P⁺ high concentration layer was also formed on the rear surface of the substrate. The high concentration surface layer of the single crystal Si substrate was subjected to anodization in an HF solution. The anodization was conducted under the following conditions.

current density: 7 (mA·cm⁻²)
anodization solution: $HF:H_2O:C_2H_5OH=1:1:1$
duration: 15 (min.)
thickness of the porous Si layer: 16 ($\mu$m)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 $\mu$m/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) prepared in advance were brought into contact with each other and put together. Thereafter, the wafer was heat treated at 1,180° C. for five minutes to improve the bonding strength.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration P⁺ layer as another first substrate or for another oxide film forming process as a second substrate.

EXAMPLE 13

A 10 $\mu$m thick P⁺ high concentration first layer was formed as a surface layer of a single crystal silicon substrate having an unspecified electric resistance by means of a diffusion technique as in the case of Example 1 except that the drive-in diffusion process was conducted for 10 hours. Another P⁺ high concentration layer was also formed on the rear surface of the substrate. The high concentration surface layer of the single crystal Si substrate was subjected to anodization in an HF solution. The anodization was conducted under the following conditions.

current density: 7 (mA·cm⁻²)
anodization solution: $HF:H_2O:C_2H_5OH=1:1:1$
duration: 15 (min.)
thickness of the porous Si layer: 16 ($\mu$m)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 $\mu$m/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) carrying a 500 nm thick $SiO_2$ layer thereon and prepared in advance were brought into contact with each other and put together. Thereafter, the wafer was heat treated at 1,180° C. for five minutes to improve the bonding strength.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 µm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 µm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration $P^+$ layer as another first substrate or for another bonding process as a second substrate.

EXAMPLE 14

A 5 µm thick $P^+$ high concentration layer was formed as a surface layer of a single crystal silicon substrate of a regenerated wafer by means of a diffusion technique. Another $P^+$ high concentration layer was also formed on the rear surface of the substrate. The high concentration surface layer of the single crystal Si substrate was subjected to anodization in an HF solution. The anodization was conducted under the following conditions.

current density: 7 (mA·cm$^{-2}$)
anodization solution: HF:H$_2$O:C$_2$H$_5$OH=1:1:1
duration: 15 (min.)
thickness of the porous Si layer: 16 (µm)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 µm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 µm/min.

Additionally, an SiO$_2$ layer was formed to a thickness of 100 nm by thermally oxidizing the surface of the epitaxially grown Si layer.

The surface of the SiO$_2$ layer and the corresponding surface of an Si substrate (second substrate) carrying a 500 nm thick SiO$_2$ layer thereon and prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 µm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 µm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration $P^+$ layer as another first substrate or for another oxide film forming process as a second substrate.

EXAMPLE 15

A 5 µm thick $P^+$ high concentration layer was formed as a surface layer of a single crystal silicon substrate of a regenerated wafer by means of a diffusion technique as in the case of Example 1. Another $P^+$ high concentration layer was also formed on the rear surface of the substrate. The high concentration surface layer of the single crystal Si substrate was subjected to anodization in an HF solution. The anodization was conducted under the following conditions.

current density: 7 (mA·cm$^{-2}$)
anodization solution: HF:H$_2$O:C$_2$H$_5$OH=1:1:1
duration: 15 (min.)
thickness of the porous Si layer: 16 (µm)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 μm/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration $P^+$ layer as another first substrate or for another bonding process as a second substrate.

EXAMPLE 16

A 5 μm thick $P^+$ high concentration layer was formed as a surface layer of a single crystal silicon substrate of a regenerated wafer by means of a diffusion technique as in the case of Example 1. Another $P^+$ high concentration layer was also formed on the rear surface of the substrate. The high concentration surface layer of the single crystal Si substrate was subjected to anodization in an HF solution. The anodization was conducted under the following conditions.

current density: 7 ($mA \cdot cm^{-2}$)
anodization solution: $HF:H_2O:C_2H_5OH=1:1:1$
duration: 15 (min.)
thickness of the porous Si layer: 16 (μm)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon.

Thereafter, the thin oxide film produced on the uppermost surface of the substrate where the porous layer had been formed was removed by immersing it in a 1.25% HF solution. Subsequently, the obtained substrate was subjected to heat treatment at 1,050° C. and 760 Torr for 1 minute in a flow of $H_2$ flowing at a rate of 230l/min. and for more 5 minutes after adding $SiH_4$ by 50 sccm.

Then, single crystal Si was made to epitaxially grow to a thickness of 0.15 μm on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 μm/min.

Additionally, an $SiO_2$ layer was formed to a thickness of 100 nm by thermally oxidizing the surface of the epitaxially grown Si layer.

The surface of the $SiO_2$ layer and the corresponding surface of an Si substrate (second substrate) prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere.

The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

Finally, the porous Si remaining on the first substrate was also selectively etched of f in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration $P^+$ layer as another first substrate or for another bonding process as a second substrate.

What is claimed is:

1. A method of manufacturing a semiconductor article, characterized by comprising steps of:
   forming a diffusion region at least on the surface of one of the sides of a silicon substrate by diffusing an element capable of controlling the conduction type;
   forming a porous silicon layer in a region including said diffusion region;
   preparing a first substrate by forming a nonporous semiconductor layer on said porous silicon layer;
   bonding said first substrate and a second substrate together to produce a multilayer structure with said nonporous semiconductor layer located inside;
   splitting said multilayer structure along said porous silicon layer but not along said diffusion region; and
   removing the porous silicon layer remaining on said split second substrate.

2. A method of manufacturing a semiconductor article according to claim 1, wherein said step of forming a diffusion region is performed by means of a diffusion technique.

3. A method of manufacturing a semiconductor article according to claim 2, wherein said element capable of controlling the conduction type is an element capable of controlling the conduction type of silicon to the n-type.

4. A method of manufacturing a semiconductor article according to claim 3, wherein said element capable of controlling the conduction type is selected from P, As and Sb.

5. A method of manufacturing a semiconductor article according to claim 2, wherein said element capable of controlling the conduction type is an element capable of controlling the conduction type of silicon to the p-type.

6. A method of manufacturing a semiconductor article according to claim 5, wherein said element capable of controlling the conduction type is B.

7. A method of manufacturing a semiconductor article according to claim 2, wherein said diffusion technique is adapted to thermally diffuse said element into said silicon substrate.

8. A method of manufacturing a semiconductor article according to claim 6, wherein said element capable of controlling the conduction type is supplied in the form of gas.

9. A method of manufacturing a semiconductor article according to claim 8, wherein said gas is $B_2H_6$.

10. A method of manufacturing a semiconductor article according to claim 6, wherein said element capable of controlling the conduction type is supplied in the form of liquid.

11. A method of manufacturing a semiconductor article according to claim 10, wherein said liquid is $BBr_3$.

12. A method of manufacturing a semiconductor article according to claim 6, wherein said element capable of controlling the conduction type is supplied in the form of solid.

13. A method of manufacturing a semiconductor article according to claim 12, wherein said solid is $B_2O_3$.

14. A method of manufacturing a semiconductor article according to claim 6, wherein said element capable of controlling the conduction type is supplied from a solid object arranged on said silicon substrate.

15. A method of manufacturing a semiconductor article according to claim 14, wherein said solid object is selected from CVD film, BSG and spin-coated film.

16. A method of manufacturing a semiconductor article according to claim 2, wherein the concentration of said element capable of controlling the conduction type and contained i n said diffusion region is controlled within a range between $5.0 \times 10^{16}/cm^3$ and $5.0 \times 10^{20}/cm^3$.

17. A method of manufacturing a semiconductor article according to claim 16, wherein the concentration of said element capable of controlling the conduction type and contained in said diffusion region is controlled within a range between $1.0 \times 10^{17}/cm^3$ and $2.0 \times 10^{20}/cm^3$.

18. A method of manufacturing a semiconductor article according to claim 17, wherein the concentration of said element capable of controlling the conduction type and contained in said diffusion region is controlled within a range between $5.0 \times 10^{17}/cm^3$ and $1.0 \times 10^{20}/cm^3$.

19. A method of manufacturing a semiconductor article according to claim 2, wherein the thickness of said diffusion layer is controlled within a range between 100 Å and 100 μm.

20. A method of manufacturing a semiconductor article according to claim 19, wherein the thickness of said diffusion layer is controlled within a range between 500 Å and 50 μm.

21. A method of manufacturing a semiconductor article according to claim 20, wherein the thickness of said diffusion layer is controlled within a range between 5,000 Å and 30 μm.

22. A method of manufacturing a semiconductor article according to claim 1, wherein the thickness of said porous silicon layer is controlled within a range between 1 μm and 150 μm.

23. A method of manufacturing a semiconductor article according to claim 22, wherein the thickness of said porous silicon layer is controlled within a range between 2 μm and 80 μm.

24. A method of manufacturing a semiconductor article according to claim 23, wherein the thickness of said porous silicon layer is controlled within a range between 5 μm and 50 μm.

25. A method of manufacturing a semiconductor article according to claim 1, wherein a diffusion region and a porous layer are formed on each of the oppositely disposed surfaces of said silicon substrate a nd subsequently a nonporous semiconductor layer is formed on each of said porous layers.

26. A met hod of manufacturing a semiconductor article according to claim 1, wherein said step of splitting said multilayer structure is performed by externally applying force to said porous layer.

27. A method of manufacturing a semiconductor article according to claim 26, wherein said application of force is performed by applying pressure, tensile force in a direction perpendicular to the substrate surface or shearing force.

28. A method of manufacturing a semiconductor article according to claim 1, wherein said step of splitting said multilayer structure is performed by exposing the porous silicon at an end of the structure and subsequently oxidizing the bonded substrates.

29. A method of manufacturing a semiconductor article according to claim 1, wherein said step of splitting said multilayer structure is performed by heating said multilayer structure.

30. A method of manufacturing a semiconductor article according to claim 29, wherein said heating is performed by entirely heating said porous multilayer structure.

31. A method of manufacturing a semiconductor article according to claim 29, wherein said heating is performed by partly heating said multilayer structure.

32. A method of manufacturing a semiconductor article according to claim 31, wherein said heating is performed by means of laser irradiation.

33. A method of manufacturing a semiconductor article according to claim 32, wherein said laser is carbon dioxide laser.

34. A method of manufacturing a semiconductor article according to claim 31, wherein said heating is performed by flowing an electric current through said porous silicon layer.

35. A method of manufacturing a semiconductor article according to claim 1, wherein said porous silicon layer is obtained by anodizing said silicon substrate.

36. A method of manufacturing a semiconductor article according to claim 1, wherein said nonporous semiconductor layer comprises a single crystal silicon layer.

37. A method of manufacturing a semiconductor article according to claim 36, wherein said single crystal silicon layer is formed by means of epitaxial growth.

38. A method of manufacturing a semiconductor article according to claim 36, wherein said first substrate is prepared by forming a silicon oxide layer on said single crystal silicon layer.

39. A method of manufacturing a semiconductor article according to claim 38, wherein said silicon oxide layer is formed by means of thermal oxidation.

40. A method of manufacturing a semiconductor article according to claim 1, wherein said porous semiconductor layer comprises a compound semiconductor layer.

41. A method of manufacturing a semiconductor article according to claim 40, wherein said compound semiconductor layer has single crystal structure.

42. A method of manufacturing a semiconductor article according to claim 1, wherein said second substrate comprises a single crystal silicon substrate.

43. A method of manufacturing a semiconductor article according to claim 1, wherein said second substrate is prepared by forming oxide film on the surface of said single crystal silicon substrate.

44. A method of manufacturing a semiconductor article according to claim 1, wherein said second substrate comprises a light transmitting substrate.

45. A method of manufacturing a semiconductor article according to claim 44, wherein said light transmitting substrate comprises a glass substrate.

46. A method of manufacturing a semiconductor article according to claim 1, wherein said bonding step is performed by bringing the two substrate into close contact with each other.

47. A method of manufacturing a semiconductor article according to claim 1, wherein said bonding step is performed by means of anodic bonding, pressurization and heat treatment.

48. A method of manufacturing a semiconductor article according to claim 1, wherein said step of removing said porous silicon layer is performed by means of polishing.

49. A method of manufacturing a semiconductor article according to claim 1, wherein said step of removing said porous silicon layer is performed by means of etching.

50. A method of manufacturing a semiconductor article according to claim 49, wherein said etching is performed by using hydrofluoric acid.

51. A method of manufacturing a semiconductor article, characterized by comprising steps of:
   forming a diffusion region at least on the surface of one of the sides of a silicon substrate by diffusing an element capable of controlling the conduction type;
   forming a porous silicon layer in a region including said diffusion region;
   preparing a first substrate by forming a nonporous semiconductor layer on said porous silicon layer;
   bonding said first substrate and a second substrate together to produce a multilayer structure with said nonporous semiconductor layer located inside;
   splitting said multilayer structure along said porous silicon layer but not along said diffusion region;
   removing the porous silicon layer remaining on said split second substrate; and
   reusing the substrate obtained by removing the porous layer remaining on said separated first substrate as material of another first substrate.

52. A method of manufacturing a semiconductor article, characterized by comprising steps of:
   forming a diffusion region at least on the surface of one of the sides of a silicon substrate by diffusing an element capable of controlling the conduction type;
   forming a porous silicon layer in a region including said diffusion region;
   preparing a first substrate by forming a nonporous semiconductor layer on said porous silicon layer;
   bonding said first substrate and a second substrate together to produce a multilayer structure with said nonporous semiconductor layer located inside;
   splitting said multilayer structure along said porous silicon layer but not along said diffusion region; removing the porous silicon layer remaining on said split second substrate; and
   reusing the substrate obtained by removing the porous layer remaining on said separated first substrate as material of another second substrate.

53. A method of manufacturing a semiconductor article, comprising:
   forming a region incorporating an element capable of controlling the conduction type at least on the surface of a side of a silicon substrate;
   forming a porous silicon layer in said region;
   preparing a first substrate by forming a nonporous semiconductor layer on said porous silicon layer;
   bonding said first substrate and a second substrate together to produce a multilayer structure with said nonporous semiconductor layer located inside;
   splitting said multilayer structure along said porous silicon layer.

54. A method of manufacturing a semiconductor article, comprising:
   forming a p-type region incorporating an element capable of controlling the conduction type at least on the surface of a side of a silicon substrate;

forming a porous silicon layer in said p-type region;

preparing a first substrate by forming a nonporous semiconductor layer on said porous silicon layer;

bonding said first substrate and a second substrate together to produce a multilayer structure with said nonporous semiconductor layer located inside;

splitting said multilayer structure along said porous silicon layer.

55. A method of manufacturing a semiconductor article, comprising:

forming a highly doped region incorporating an element capable of controlling the conduction type at least on the surface of one of the sides of a silicon substrate;

forming a porous silicon layer in said highly doped region;

preparing a first substrate by forming a nonporous semiconductor layer on said porous silicon layer;

bonding said first substrate and a second substrate together to produce a multilayer structure with said nonporous semiconductor layer located inside;

splitting said multilayer structure along said porous silicon layer.

* * * * *

UNITED STATES PATENT AND TRADEMARK OFFICE
CERTIFICATE OF CORRECTION

PATENT NO. : 6,100,165
DATED : August 8, 2000
INVENTOR(S) : Kiyofuni Sakaguchi et al.

It is certified that error appears in the above-identified patent and that said Letters Patent is hereby corrected as shown below:

Columns 1-42 should be deleted and substitute with the attached sheets consisting of Columns 1-42 as amended.

Signed and Sealed this

Sixth Day of May, 2003

JAMES E. ROGAN
*Director of the United States Patent and Trademark Office*

METHOD OF MANUFACTURING SEMICONDUCTOR ARTICLE

BACKGROUND OF THE INVENTION

1. Field of the Invention

This invention relates to a method of manufacturing a semiconductor article that can suitably be used for producing a semiconductor device such as a semiconductor integrated circuit, a solar cell, a semiconductor laser device or a light emitting diode. More particularly, it relates to a method of manufacturing a semiconductor article comprising a step of transferring a semiconductor layer onto a substrate.

2. Related Background Art

Semiconductor articles are popular in terms of semiconductor wafers, semiconductor substrates and various semiconductor devices, and include those adapted for producing semiconductor devices by utilizing the semiconductor region thereof and those used as preforms for producing semiconductor devices.

Some semiconductor articles of the type under consideration comprise a semiconductor layer arranged on an insulator.

The technology of forming a single crystal silicon semiconductor layer on an insulator is referred to as silicon on insulator (SOI) technology, which is widely known. Much research has been done to exploit the remarkable advantages of SOI that cannot be achieved by using bulk Si substrates that are used for producing ordinary Si integrated circuits. The advantages of the SOI technology include:

1. the ease of dielectric isolation that allows an enhanced degree of integration;
2. the excellent resistivity against radiation;
3. a reduced floating capacitance that allows a high device operation speed;
4. the omission of the well forming step;
5. the effect of latch up prevention; and
6. the possibility of producing fully depleted field effect transistors using the thin film technology. The advantages of the SOI technology are thoroughly discussed in Special Issue: "Single-crystal silicon on non-single-crystal insulators"; edited by G. W. Cullen, Journal of Crystal Growth, volume 63, No. 3, pp. 429–590 (1983).

In recent years, a number of reports have been published on SOI technology for providing substrates that can realize high speed operation and low power consumption for MOS-FETs (IEEE SOI conference 1994). The process of manufacturing a semiconductor device can be significantly shortened by using the SOI structure if compared with the corresponding process of manufacturing a device on a bulk Si wafer because of the implementation of a very simplified device isolation step. Thus, the use of the SOI technology can provide a significant cost reduction in manufacturing a semiconductor device particularly in terms of the wafer cost and the process cost if viewed from the conventional technology of manufacturing a MOSFET or an IC on a bulk Si substrate, to say nothing of the remarkable performance of such a semiconductor device.

Fully depleted MOSFETs are very promising for achieving high speed operation and low power consumption if provided with improved drive power. Generally speaking, the threshold voltage (Vth) of a MOSFET is determined as a function of the impurity concentration of its channel section but, in the case of a fully depleted (FD) MOSFET, the characteristics of the depletion layer are influenced by the SOI film thickness. Therefore, the SOI film thickness has to be rigorously controlled in order to improve the yield of manufacturing LSIs.

Meanwhile, a device formed on a compound semiconductor shows a remarkable level of performance that cannot be expected from silicon particularly in terms of high speed operation and light emission. Such devices are currently formed by means of epitaxial growth on a compound semiconductor substrate that may be made of GaAs or a similar compound. However, a compound semiconductor substrate is costly and mechanically not very strong so that it is not adapted to produce a large wafer.

Thus, efforts have been made to form a compound substrate by hetero-epitaxial growth on a Si wafer that is inexpensive, mechanically strong and good for producing a large wafer.

Research on forming SOI substrates became significant in the 1970s. Initially, attention was paid to the technique of producing single crystal silicon by epitaxial growth on a sapphire substrate (SOS: silicon on sapphire), that of producing an SOI structure through full isolation by porous oxidized silicon (FIPOS), and the oxygen ion implantation technique. The FIPOS method comprises steps of forming an islanded N-type Si layer on a P-type single crystal Si substrate by proton/ion implantation (Imai et al., J. Crystal Growth, Vol. 63, 547 (1983)) or by epitaxial growth and patterning, transforming only the P-type Si substrate into a porous substrate by anodization in a HF solution, shielding the Si islands from the surface, and then subjecting the N-type Si islands to dielectric isolation by accelerated oxidation. This technique is, however, accompanied by a problem that the isolated Si region is defined before the process of producing devices and restricts the freedom of device design.

The oxygen ion implantation method is also referred to as the SIMOX method, which was first proposed by K. Izumi. With this technique, oxygen ions are implanted into a Si wafer to a concentration level of $10^{17}$ to $10^{18}$/cm$^2$ and then the latter is annealed at high temperature of about 1,320° C. in an argon/oxygen atmosphere. As a result, the implanted oxygen ions are chemically combined with Si atoms to produce a silicon oxide layer that is centered at a depth corresponding to the projection range (Rp) of the implanted ions. Under this condition, an upper portion of the Si oxide layer that is turned into an amorphous state by the oxygen ion implantation is recrystallized to produce a single crystal Si layer. While the surface Si layer used to show a defect rate as high as $10^5$/cm$^2$, a recent technological development has made it possible to reduce the defect rate down to about $10^2$/cm$^2$ by selecting a rate of oxygen implantation of about $4 \times 10^{17}$/cm$^2$. However, the allowable range of energy infusion and that of ion implantation are limited if the film quality of the Si oxide layer and the crystallinity of the surface Si layer are to be held to respective desired levels. Hence the film thickness of the surface Si layer and that of the buried Si oxide (BOX; buried oxide) layer are allowed to take only limited values. In other words, a process of sacrifice oxidation or epitaxial growth is indispensable to realize a surface Si layer having a desired film thickness. Such a process by turn gives rise to a problem of uneven film thickness due to the intrinsic adverse effect of the process.

There have been reports saying that SIMOX can produce defective Si oxide regions in the Si oxide layer that are referred to as pipes. One of the possible causes of the phenomenon may be foreign objects such as dust introduced into the layer at the time of ion implantation. The device produced in a pipe region can show degraded characteristics due to the leak current between the active layer and the underlying substrate.

The SIMOX technique involves the use of a large volume of ions that is by far greater than the volume used in the ordinary semiconductor process and hence the ion implantation process may take a long time if a specifically designed apparatus is used for it. Since the ion implantation process is performed typically by means of raster scan of an ion beam showing a predetermined flow rate of electric current or by spreading an ion beam, a long time may be required for processing a large wafer. Additionally, when a large wafer is processed at high temperature, the slip problem due to an uneven temperature distribution within the wafer can become very serious. Since the SIMOX process requires the use of extraordinary high temperature that is as high as 1,320° C. which is not observed in the ordinary Si semiconductor process, the problem of uneven temperature distribution will become more serious if a large wafer has to be prepared unless a highly effective apparatus is not realized.

Beside the above-described known techniques of forming SIO, a technique of bonding a single crystal Si substrate to another single crystal Si substrate that has been thermally oxized to produce a SOI structure has been proposed recently. This method requires the use of an active layer having an even thickness for the devices to be formed on it. More specifically, a single crystal Si substrate that is as thick as several hundreds micrometers has to be made as thin as several micrometers or less. Three techniques have been known for thinning a single crystal Si layer that include;

(1) polishing,
(2) local plasma etching; and
(3) selective etching.

It is difficult to achieve an even film thickness by means of the polishing technique. Particularly, the mean deviation in the film thickness can be as large as tens of several percent to make the technique unfeasible when the film is thinned to an order of sub-micrometer. This problem will become more significant for wafers having a large diameter.

The technique of local plasma etching is typically used in combination with that of polishing. More specifically, the film is thinned by means of polishing to about 1 to 3 μm, and the distribution of film thickness is determined by observing the film thickness at a number of points. Then, the film is subjected to an etching operation where the film is scanned with plasma of $SF_6$ particles having a diameter of several millimeters, correcting the distribution of film thickness, until a desired film thickness is obtained. There has been a report that the distribution of film thickness can be confined within about ±10 nm or less by means of this technique. However, this process is accompanied by a drawback that, if foreign objects are present on the substrate in the form of particles during the plasma etching, they operate as so many etching masks to produce projections on the substrate when the etching operation is over.

Additionally, since the substrate shows a coarse surface immediately after the etching operation, a touch-polishing operation has to be conducted on the surface after the end of the plasma etching and the operation is controlled only in terms of its duration. Then, again the problem of deviations in the film thickness due to polishing arises. Still additionally, a polishing agent typically containing colloidal silica is used for the polishing operation and hence the layer for making an active layer is directly scraped by the polishing agent so that a crushed and/or distorted layer may be produced. The throughput of the process can be significantly reduced when large wafers are treated because the duration of the plasma etching operation is prolonged as a function of the surface area of the wafer being processed.

Selective etching involves the use of a film configuration for the substrate to be thinned that comprises one or more than one film layers adapted to selective etching. For example, assume that a $P^+$-Si thin layer containing boron by more than $10^{19}/cm^3$ and a P-type Si thin layer are made to grow sequentially on a P-type substrate by means of epitaxial growth to produce a first substrate, which is then bonded to a second substrate with an insulation layer interposed therebetween, the insulation layer being typically an oxide film, and that the rear surface of the first substrate is made sufficiently thin in advance by scraping and polishing. Subsequently, the $P^+$-layer is made to become exposed by selectively etching the overlying P-type layer and then the P-type substrate is made to become exposed by selectively etching the $P^+$-layer to produce a SOI structure. This technique is discussed in detail in a report by Maszara (W. P. Maszara, J. Electrochem. Soc., Vol. 138,341 (1991)).

While the selective etching technique is effective for producing a thin film with an even film thickness, it is accompanied by the drawbacks as identified below.

The selective etching ratio is not satisfactory and will be as low as $10^2$ at most.

A touch-polishing operation is required to smooth the surface after the etching operation because of the coarse surface produced by the etching operation. Therefore, the film thickness can lose the uniformity as it is reduced by polishing. Particularly, while the polishing operation is controlled by the duration of the operation, it is difficult to rigorously control the operation because the polishing rate can vary significantly from time to time. Thus, this problem becomes significant when forming an extremely thin SOI layer that is as thin as 100 nm.

The SOI layer can show a poor crystallinity due to the use of a film forming technique that involves ion implantation and epitaxial or hetero-epitaxial growth on a Si layer that is densely doped with B. Additionally, the bonded surface of the substrate may show a degree of smoothness that is inferior relative to that of a conventional Si wafer (C. Harendt, et al., J. Elect. Mater. Vol. 20,267 (1991), H. Baumgart, et al., Extended Abstract of ECS 1st International Symposium of Wafer Bonding, pp-733 (1991), C. E. Hunt, Extended Abstract of ECS 1st International Symposium of Wafer Bonding, pp-696 (1991)). Still additionally, there is a problem that the selectivity of the selective etching technique heavily depends on the concentration difference among the impurities such as boron contained in the substrate and the steepness of the concentration profile of the impurities along the depth of the substrate. Therefore, if the bonding anneal is conducted at high temperature to improve the bonding strength of the layers and the epitaxial growth is carried out also at high temperature to enhance the crystallinity of the SOI layer, the concentration profile of the impurities along the depth becomes flattened to reduce the selectivity of the etching operation. Simply stated, the improvement of the etching selectivity and hence that of the crystallinity and the improvement of the bonding strength are conflicting requirements that cannot be met at the same time.

Under these circumstances, the inventors of the present invention proposed a novel method of manufacturing a semiconductor article in Japanese Patent Application Laid-Open No. 5-21338. According to the invention, the proposed method is characterized by comprising steps of forming an article by arranging a nonporous single crystal semiconductor region on a porous single crystal semiconductor region, bonding the surface of a material carrying an insulating material thereon to the corresponding surface of said porous single crystal semiconductor region and subsequently removing said porous single crystal semiconductor region by etching.

T. Yonehara et al. who are the inventors of the present invention also reported a bonded SOI that is excellent in terms of even film thickness and crystallinity and adapted to batch processing (T. Yonehara et al., Appl. Phys. Lett. Vol. 642,108 (1994)). The proposed method of manufacturing a bonded SOI will be summarily described below by referring to FIGS. 4A through 4C of the accompanying drawings.

Figure 4A:
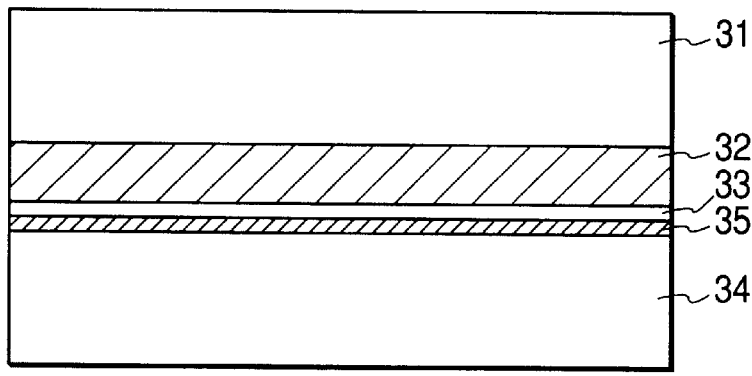
FIGS. 4A, 4B and 4C are schematic cross sectional lateral views of a semiconductor article being manufactured by a first known method.
Figure 4B:
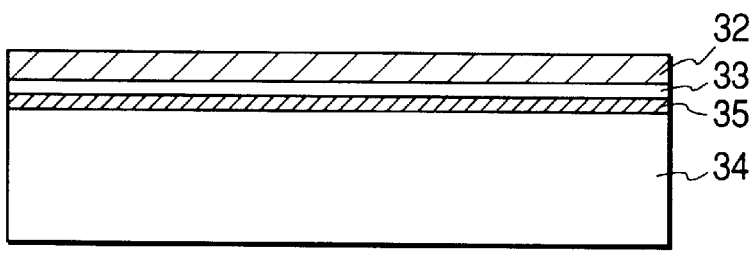
Figure 4C:
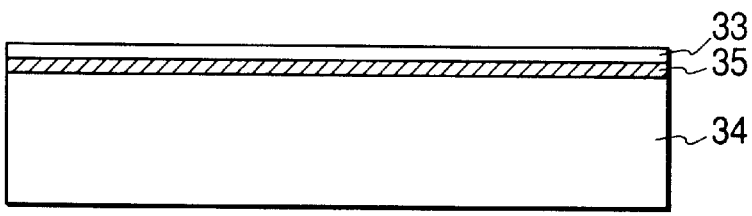

The proposed method uses a porous layer 32 formed on a first Si substrate 31 as a layer to be selectively etched. After forming a nonporous single crystal Si layer 33 on the porous layer 32 by epitaxial growth, it is bonded to a second substrate 34 with a Si oxide layer 35 interposed therebetween (FIG. 4A). Then, the porous Si layer is exposed over the entire surface area of the first substrate by scraping off the first substrate from the rear side (FIG. 4B). The exposed porous Si is then etched out by means of a selective etching solution typically containing KOH or $HF+H_2O_2$ (FIG. 4C). Since the selective etching ratio of the operation of etching the porous Si layer relative to the bulk Si layer (nonporous single crystal Si layer) can be made as high as hundreds of thousands with this technique, the nonporous single crystal Si layer formed on the porous layer in advance can be transferred onto the second substrate to produce a SOI substrate without reducing the thickness of the nonporous single crystal Si layer. Thus, the uniformity of the film thickness of the SOI substrate is determined during the epitaxial growth step. According to a report by Sato et al., since a CVD system adapted to an ordinary semiconductor process can be used for the epitaxial growth, a degree of uniformity of the film thickness as high as 100 nm±2% can be realized. Additionally, the epitaxial Si layer shows an excellent crystallinity of about $3.5 \times 10^2/cm^2$.

Since the selectivity of any conventional selective etching technique heavily depends on the concentration difference among the impurities contained in the substrate and the steepness of the concentration profile of the impurities along the depth of the substrate as described above, the temperature of the heat treatment (for bonding, epitaxial growth, oxidation and so on) is limited to as low as 800° C. at most because the impurity concentration profile becomes flattened above that temperature limit. On the other hand, the etching rate of the proposed etching technique is mainly determined by the structural difference between the porous layer and the bulk layer so that the heat treatment is not subjected to such a rigorous limitation and temperature as high as 1,180° C. can be used. It is known that a heat treatment process conducted after the bonding operation can remarkably improve the bonding strength between wafers and reduce the size and number of voids given rise to on the bonding interface. Additionally, with a selective etching operation relying the structural difference between the porous layer and the bulk layer, the uniformity of the film thickness is not adversely affected by fine particles that can be adhering to the porous Si layer.

However, a semiconductor substrate to be produced by way of a bonding process inevitably requires at least two wafers as starting materials, one of which is substantially wasted away in the course of polishing and etching to consume the limited natural resources. In other words, a SOI manufacturing process is required to realize low cost and economic feasibility in addition to an enhanced degree of process controllability and an improved uniformity of the film thickness.

Differently stated, the requirements of a process for manufacturing a high quality SOI substrate include an excellent reproducibility, an enhanced level of resource saving capability through the repeated use of a same wafer and low manufacturing cost.

Under these circumstances, the inventors of the present invention proposed in Japanese Patent Application Laid-Open No. 7-302889 a method of manufacturing a semiconductor substrate, with which a pair of substrates are bonded together and subsequently separated from each other through a porous layer arranged therebetween so that one of the substrates may be reused by removing the porous substance remaining on it. The disclosed method will now be summarily described below by referring to FIGS. 5A through 5C of the accompanying drawings.

Figure 5A:
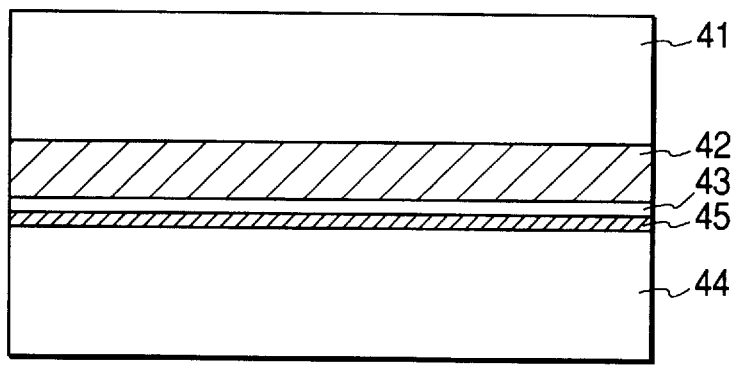
FIGS. 5A, 5B and 5C are schematic cross sectional lateral views of a semiconductor article being manufactured by a second known method.

It comprises steps of forming a porous layer 42 by transforming a surface layer of a first Si substrate 41 into a porous state, forming a single crystal Si layer 43 on the porous layer, bonding the single crystal Si layer to the main surface of a second Si substrate 44 with an insulation layer 45 interposed therebetween (FIG. 5A). It further comprises steps of separating the wafers bonded together with the porous layer arranged therebetween (FIG. 5B) and selectively removing the exposed porous Si layer on the surface of the second Si substrate to produce a SOI substrate (FIG. 5C). With this method, the first substrate 41 can be reused after removing the residual porous layer. The bonded wafers may be separated from each other typically by way of one of the following techniques;

applying sufficiently strong tensile force or pressure onto a surface of the combined wafers along a direction perpendicular to the surface;

applying wave energy in the form of an ultrasonic wave or the like to the combined wafers;

causing the porous layer to be exposed at an end surface of the combined wafers, etching the porous Si layer to a certain extent and inserting the edge of a blade;

causing the porous layer to be fully exposed at an end surface of the wafers, soaking the porous Si layer with liquid that may be water and causing the liquid to expand by entirely heating or cooling the combined wafers; and applying force to the first (or second) substrate along a direction parallel to the second (or first) substrate in order to destroy the porous Si layer.

The above listed techniques are based on the idea that, while the mechanical strength of the porous Si layer depends on the porosity of the layer, it is sufficiently lower than that of a bulk Si layer. As a rule of thumb, a porous Si layer having a porosity of 50% shows a mechanical strength about a half of that of a corresponding bulk Si layer. In short, when a pair of bonded wafers is subjected to compressive, tensile or shearing force, the porous Si layer will be destroyed to begin with. A porous layer showing a higher degree of porosity can be destroyed with less force.

However, in reality, efforts have been paid to reduce the porosity of the surface layer of the porous Si in order to realize an excellent epitaxial growth in terms of the quality of the device formed on the SOI substrate, while increasing the porosity of the inside of the porous Si for easy separation of the bonded wafers. Thus, as described in an example disclosed in Japanese Patent Application Laid-Open No.

7-302889, it has been a known practice to modify the porosity of the porous Si layer by controlling the electric current used in an anodization process.

On the other hand, the above identified Japanese Patent Application Laid-Open No. 7-302889 discloses that a substrate that has been used for preparing a semiconductor substrate can be reused for preparing another semiconductor substrate and hence it provides a very useful technique for reducing the cost of manufacturing semiconductor substrates.

More specifically, Japanese Patent Application Laid-Open No. 7-302889 discloses a technique that uses anodization for transforming a silicon substrate into a porous state. In a plant where a large number of silicon substrates have to be uniformly transformed into a porous state, the specific resistance of the substrate has to be rigorously controlled because an anodization process utilizes an anodic reaction of silicon. However, a silicon substrate showing a specified specific resistance is costly and hence the cost of manufacturing an SOI substrate can be significantly reduced if it can prepared disregarding its specific resistance.

SUMMARY OF THE INVENTION

In view of the above-described circumstances, it is therefore an object of the present invention to provide a method of manufacturing a semiconductor article comprising a step of bonding a pair of substrates, wherein part of the substrates is reused as raw material for manufacturing another semiconductor article.

Another object of the present invention is to provide a method of manufacturing a semiconductor article, characterized by comprising steps of forming a diffusion region at least on the surface of one of the sides of a silicon substrate by diffusing an element capable of controlling the conduction type, forming a porous silicon layer in a region including said diffusion region, preparing a first substrate by forming a nonporous semiconductor layer on said porous silicon layer, bonding said first substrate and a second substrate together to produce a multilayer structure with said nonporous semiconductor layer located inside, splitting said multilayer structure along said porous silicon layer but not along said diffusion region and removing the porous silicon layer remaining on said split second substrate.

Still another object of the present invention is to provide a method of manufacturing a semiconductor article, characterized by forming a diffusion region at least on the surface of one of the sides of a silicon substrate by diffusing an element capable of controlling the conduction type, forming a porous silicon layer in a region including said diffusion region, preparing a first substrate by forming a nonporous semiconductor layer on said porous silicon layer, bonding said first substrate and a second substrate together to produce a multilayer structure with said nonporous semiconductor layer located inside, splitting said multilayer structure along said porous silicon layer but not along said diffusion region, removing the porous silicon layer remaining on said split second substrate and reusing the substrate obtained by removing the porous layer remaining on said separated first substrate as material of another first substrate.

A further object of the present invention is to provide a method of manufacturing a semiconductor article, characterized by forming a diffusion region at least on the surface of one of the sides of a silicon substrate by diffusing an element capable of controlling the conduction type, forming a porous silicon layer in a region including said diffusion region, preparing a first substrate by forming a nonporous semiconductor layer on said porous silicon layer, bonding said first substrate and a second substrate together to produce a multilayer structure with said nonporous semiconductor layer located inside, splitting said multilayer structure along said porous silicon layer but not along said diffusion region, removing the porous silicon layer remaining on said split second substrate and reusing the substrate obtained by removing the porous layer remaining on said separated first substrate as material of another second substrate.

With a method of manufacturing a semiconductor article according to the invention, after forming a diffusion region (high concentration impurity region) at least on the surface of one of the sides of a silicon substrate by diffusing an element capable of controlling conductivity, a porous silicon layer is formed in a region including said diffusion region. Thus, a desired value can be selected for the concentration of the element (impurity concentration as generally referred to in the field of the semiconductor industry) capable of controlling conductivity in the diffusion region that provides the basis of forming a porous silicon layer. In other words, a relatively low cost silicon wafer or a regenerated wafer that does not have a specified specific resistivity can be used for various applications where a silicon substrate having a specified specific resistivity is used ("a regenerated wafer" as used herein refers to a wafer obtained by polishing and removing the surface layer of a monitor wafer used in an IC process or a wafer carrying thereon one or more than one defective devices to such an extent that it can be reused in an IC process). Therefore, with a method of manufacturing a semiconductor article according to the invention, a semiconductor article can be manufactured at a cost by far lower than the cost of manufacturing it by means of any known manufacturing method. Additionally, the regions of the porous silicon layer other than the diffusion region are structurally by far more fragile than the diffusion region that is porous so that they can be destroyed very easily in the splitting process and the first and second substrates can be separated from each other easily and reliably. In other words, a fragile structure can be produced within the porous silicon layer without modifying the electric current in the course of the process of forming the porous silicon layer. Thus, a couple of porous silicon layers can be automatically and sequentially formed without changing the anodizing conditions so that the surface porous silicon layer may be used for forming a high quality epitaxial layer while the underlying porous silicon layer may effectively operate as separation layer.

A diffusion region can be formed on both the principal surface and the rear surface of a silicon substrate by means of a diffusion technique. With a silicon wafer carrying a diffusion region on both of its oppositely disposed surfaces, the electric resistance between the rear surface of the wafer and the + electrode can be reduced for forming a porous layer to a great advantage of causing a uniform current to flow along the surface of the wafer so that a porous silicon layer may be formed with a very uniform thickness. While a technique such as ion implantation or epitaxial growth may alternatively be used for forming a high concentration impurity region (particularly $P^+$ layer), unlike a diffusion technique, these techniques are effective only for treating only one of the oppositely disposed surfaces of a substrate and hence cannot be used to produce a $P^+$ layer of the rear surface of the substrate. Additionally, these techniques are costly if compared with a diffusion technique, although they can treat only one of the oppositely disposed surfaces of a substrate. Differently stated, a diffusion technique is advantageous in that it can treat both of the oppositely disposed surfaces of a substrate at relatively low cost.

Additionally, a method of manufacturing a semiconductor article according to the invention is effective in producing a highly crystalline single crystal semiconductor layer on a surface of a second substrate that may be made of an insulating substrate, Therefore, it operates excellently for manufacturing semiconductor articles in terms of productivity, uniformity, controllability and cost.

Finally, a semiconductor article manufactured by a method according to the invention is less costly and hence can effectively replace a costly SOS or SIMOX in the process of manufacturing a large scale integrated circuit having a SOI structure.

BRIEF DESCRIPTION OF THE DRAWINGS

FIGS. 1A, 1B, 1C, 1D and 1E are schematic cross-sectional lateral views of a semiconductor article being manufactured by a method according to the invention, illustrating different manufacturing steps in a mode of carrying out the invention.

FIGS. 2A, 2B, 2C, 2D and 2E are schematic cross-sectional lateral views of a semiconductor article being manufactured by a method according to the invention, illustrating different manufacturing steps in another mode of carrying out the invention.

FIG. 3 is a schematic cross-sectional view of a furnace that can be used for forming a diffusion region for the purpose of the invention.

FIGS. 4A, 4B and 4C are schematic cross sectional lateral views of a semiconductor article being manufactured by a first known method.

Figure 5B:
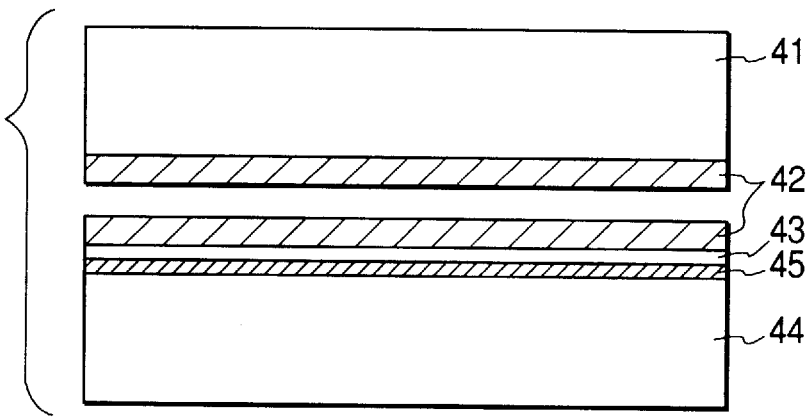
Figure 5C:
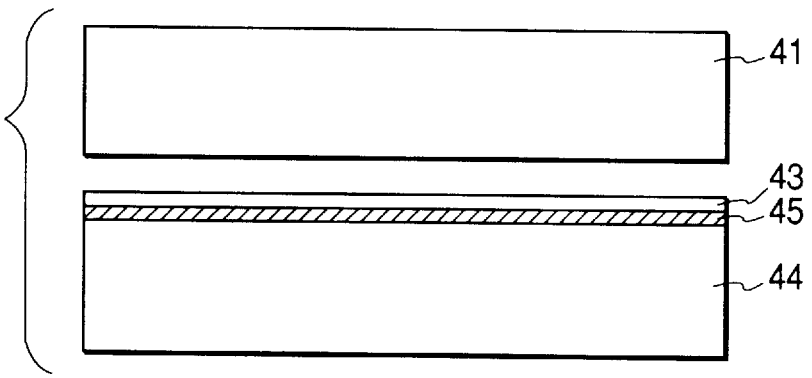

FIGS. 5A, 5B and 5C are schematic cross-sectional lateral views of a semiconductor article being manufactured by a second known method.

DETAILED DESCRIPTION OF THE PREFERRED EMBODIMENTS

Now, the present invention will be described in greater detail in terms of preferred modes and different phases of carrying out the invention. However, it will be appreciated that the present invention is by no means limited thereto and covers any other modes of realizing the invention that can be used for the purpose of the invention.

Preparation of a Diffusion Region

For the purpose of the present invention, an element adapted to being diffused into a silicon substrate by means of a diffusion technique and capable of controlling the conduction type refers to an element that is popularly used with a technique of processing a semiconductor material and can be selected from the elements listed in Table 1 below.

TABLE 1

| Elements Capable of Controlling the Conduction Type | |
| --- | --- |
| conduction type | element |
| n | P, As, Sb |
| p | B |

The diffusion technique to be used for the purpose of the present invention is preferably adapted to thermally diffuse an element capable of controlling the conduction type into a silicon substrate. Diffusion techniques that can be used for the purpose of the present invention include those listed in Table 2 below.

TABLE 2

| Techniques for Diffusing an Element | | |
| --- | --- | --- |
| diffusion technique | diffusion source | furnace |
| open pipe technique | $POCl_3$, BN, $PH_3$ | diffusion furnace |
| application technique | a piece of glass applied with the element | diffusion furnace |
| use of doped film | doped oxide (CVDPSG) doped poly-Si | diffusion furnace |
| sealed pipe tecnique | As (solid), $BCl_3$, $PH_3$ capsule | diffusion furnace |

For the purpose of the invention, a porous layer is formed within a diffusion region more easily when the diffusion region is a P-type diffusion region than when it is an N-type diffusion region. In view of this fact, techniques that can be used for diffusion B (boron) are listed in Table 3 below.

TABLE 3

| Boron Diffusion Techniques | |
| --- | --- |
| gaseous source | $B_2H_6$ |
| liquid source | $BBr_3$ |
| solid source | $B_2O_3$ |
| solid phase-solid phase diffusion | CVD film, BSG, spin-coated film |

With any of the techniques listed in Table 3, the element supplied from the source is diffused into a silicon substrate by means of a heat treatment operation conducted in a"furnace".

For example, the diffusion technique using a spin-coated film is carried out in a manner as described below.

First, a mixture of $B_2O_3$, an organic binder and a solvent is evenly applied onto a silicon substrate (wafer) by means of a spinner. The applied mixture is dried and baked to form a $B_2O_3$ film on the silicon substrate. Thereafter, the silicon substrate is placed in a furnace having a configuration as shown in FIG. 3 and subjected to a heat treatment process, where boron (B) atoms are diffused into the substrate. In FIG. 3, reference numeral 301 denotes the furnace and reference numeral 302 denotes a susceptor. The silicon substrate 100 is coated on one of the surfaces thereof with a $B_2O_3$ film. Thus, boron (B) atoms can be diffused into the silicon substrate by heating the substrate at 900 to 1,300° C. in the furnace. Note that a diffusion region is formed not only on the surface that carries thereon the $B_2O_3$ film but also on the oppositely disposed surface of the substrate when another silicon substrate carrying thereon a $B_2O_3$ film is arranged within the furnace with the $B_2O_3$ film carrying surface located vis-a-vis the surface of the first substrate carrying no $B_2O_3$ film thereon because the $B_2O_3$ film of the second substrate operates as a source for supplying $B_2O_3$.

A diffusion layer formed on both of the oppositely disposed surfaces of the silicon substrate is advantageous because it can reduce the contact resistance between the substrate and the HF solution that is used in the anodization process for forming a porous silicon layer in the diffusion region.

For the purpose of the invention, the concentration of the element contained in the diffusion region and capable of controlling the conduction type is generally between $5.0 \times 10^{16}/cm^3$ and $5.0 \times 10^{20}/cm^3$, preferably between $1.0 \times 10^{17}/cm^3$ and $2.0 \times 10^{20}/cm^3$ and most preferably between $5.0 \times$ $10^{17}$/cm$^3$ and $1.0 \times 10^{20}$/cm$^3$ from the viewpoint of the process of producing porous silicon through transformation and the characteristics of the epitaxial film formed on the porous silicon layer.

For the purpose of the invention, the thickness of the diffusion region is controllable by controlling the temperature and the duration of the heat treatment process. It is generally between 100 Å and 100 µm, preferably between 500 Å and 50 µm and most preferably between 5,000 Å and 30 µm. However, it is not necessarily required to form a thick diffusion region because the process of transforming it into a porous state that follows the process of forming the diffusion region can easily spread beyond the diffusion region.

For the purpose of the present invention, basically any single crystal silicon substrate (silicon wafer) can be used for the silicon substrate on which a diffusion region is formed. However, from the viewpoint of manufacturing a semiconductor substrate at low cost, a silicon substrate having an unspecified electric resistance, a monitor wafer that has been used in an IC process, or a regenerated wafer obtained by polishing the surface layer of a substrate carrying thereon one or more than one defective devices to such an extent that it may be reused for an IC process may advantageously be used for the purpose of the invention.

Preparation of Porous Silicon

Porous Si was firstly discovered in 1956 by Uhlir et al. who were studying a process of electropolishing a semiconductor material (A. Uhlir, Bell Syst. Tech. J., Vol. 35,333 (1956)). Porous Si can be prepared through anodization of an Si substrate in a HF solution. Unagami reports as a result of his study on the dissolutive reaction of Si in a Si anodization process that the existence of holes is required for anodization of Si and the reaction proceeds in a manner as described below (T. Unagami, J. Electrochem. Soc., Vol. 127,476 (1980)).

$$Si + 2HF + (2-n)e^+ \rightarrow SiF_2 + 2H^+ + ne^-$$

$$SiF_2 + 2HF \rightarrow SiF_4 + H_2$$

$$SiF_4 + 2HF \rightarrow H_2SiF_6$$

or $$Si + 4HF + (4-\lambda)e^+ \rightarrow SiF_4 + 4H^+ + \lambda e^-$$

$$SiF_4 + 2HF \rightarrow H_2SiF_6$$

where $e^+$ and $e^-$ represent respectively a hole and an electron and n and $\lambda$ represent respective numbers of holes required for dissolving a single Si atom. The report says that porous Si is formed when the condition of $n>2$ or $\lambda>4$ is met.

Although a conclusion that can be drawn from the above is that P-type Si can be made porous under the existence of holes whereas N-type Si cannot be made porous, in reality, both N-type Si and P-type Ni can be turned porous under certain conditions.

According to the invention, single crystal porous Si can be formed through anodization of a single crystal Si substrate typically in a HF solution. A porous Si layer shows a spongy structure where pores with a diameter between $10^{-1}$ and 10 nm are arranged with intervals between $10^{-1}$ and 10 nm. The density of porous Si can be made to vary between 2.1 and 0.6 g/cm$^3$ by varying the concentration of the HF solution between 50 and 20% and/or by varying the current density in contrast to the density of single crystal Si that is equal to 2.33 g/cm$^3$. In other words, the porosity of porous Si is variable. While porous Si can be made to show a density less than a half of that of single crystal Si, it maintains the properties as single crystal Si so that a single crystal Si layer can be formed by epitaxial growth on a porous Si layer.

A porous Si layer has a density that is less than the density of a single crystal Si layer because it contains a large number of voids in the inside. Consequently, a porous Si layer shows a dramatically large surface area relative to the volume it occupies. This means that a porous Si layer can be etched at a rate by far greater than the rate at which an ordinary single crystal Si layer is normally etched.

While porous Si shows a mechanical strength that varies depending on its porosity, it is presumably lower than that of bulk Si. For instance, if a porous Si layer shows a porosity of 50%, it may be safe to assume that its mechanical strength is about a half of that of a comparable bulk Si layer. In other words, when a wafer formed by bonding a pair of substrates is subjected to compressive, tensile or shearing force, the porous Si layer arranged therebetween will be destroyed first. If the layer has a large porosity, it will be destroyed with little effort.

As pointed above under Preparation of a Diffusion Region, the process of transforming a diffusion region into a porous state can easily spread beyond the diffusion region. For the purpose of the present invention, the thickness of the porous layer is generally between 1 and 150 µm, preferably between 2 and 80 µm and most preferably between 5 and 50 µm from the viewpoint of the time required for forming the porous layer and the desired level of fragility of the porous layer.

Nonporous Semiconductor Layer

For the purpose of the present invention, a nonporous semiconductor layer can be formed preferably by using a material selected from single crystal Si, polycrystalline Si, noncrystalline Si and compound semiconductors including GaAs, InP, GaAsP, GaAlAs, InAs, AlGaSb, InGaAs, ZnS, CdSe, CdTe and SiGe. A nonporous semiconductor layer that can be used for the purpose of the present invention may substantially contain one or more than one FETs (field effect transistors).

First Substrate

For the purpose of the present invention, the first substrate is a silicon substrate having therein a porous silicon layer and carrying a nonporous semiconductor layer arranged on the porous silicon layer. It may be prepared by forming a nonporous semiconductor layer on the porous silicon layer in the silicon substrate or by forming a porous silicon layer in part of a silicon substrate having therein a nonporous semiconductor substrate.

A nonporous semiconductor layer can be formed on a porous silicon layer typically by means of a CVD technique selected from vacuum CVD, plasma CVD, photo CVD and MO CVD (metal-organic CVD), a sputtering technique (including a bias sputtering technique), a molecular beam epitaxial growth technique or a liquid phase growth technique.

Second Substrate

For the purpose of the present invention, the second substrate onto which the nonporous semiconductor layer is transferred from the first substrate may be selected from a semiconductor substrate such as a single crystal silicon substrate, a semiconductor substrate carrying an insulation film such as an oxide film (including a thermally oxidized film) or a nitride film on the surface thereof, a light transmitting substrate such as a silica glass substrate or a glass substrate, a metal substrate and an insulating substrate typically made of alumina depending on the application of the finally prepared semiconductor article.

Bonding

For the purpose of the invention, the first substrate comprising a porous silicon layer and a nonporous semiconductor layer can be firmly bonded to a second substrate to produce a multilayer structure (in such a way that the nonporous semiconductor layer is located inside). For the purpose of the present invention, a multilayer structure having a nonporous semiconductor layer located inside refers not only to a structure obtained by bonding the nonporous semiconductor layer of a first substrate directly to a second substrate but also to a structure obtained by bonding the nonporous semiconductor layer of a first substrate carrying on the surface thereof an insulation film such as an oxide film, a nitride film or some other film to a second substrate. In other words, a multilayer structure having a nonporous semiconductor layer located inside refers to a structure where the nonporous semiconductor layer is located inside relative to the porous silicon layer.

For the purpose of the present invention, the first and second substrates can be firmly bonded together typically at room temperature by smoothing their bonding surfaces. Additionally, techniques including anodic bonding, pressurization and thermal treatment may appropriately be used to improve the bonding strength.

Splitting the Multilayer Structure

Since the porous silicon layer formed outside the diffusion region is fragile if compared with the porous silicon layer formed inside the diffusion region and hence can be easily destroyed in the process of separating the first and second substrates so that the two substrate can be separated reliably. Specific techniques that can be used for splitting the multilayer structure include application of external force that may be in the form of pressure, pulling force or shearing force, application of internal force by oxidizing and expanding the porous silicon, generation of thermal stress by applying pulsation of heat to the multilayer structure and simply softening the porous silicon layer as well as other appropriate techniques.

Removal of the Porous Layer

After separating the multilayer structure that has been prepared by bonding first and second substrates together along the porous Si layer, the residual porous Si remaining on the substrates can be selectively removed on the basis of the fact that the porous Si layer has a low mechanical strength and a large surface area. Methods that can be used for selectively removing the remaining porous Si include mechanical techniques such as scraping and polishing, chemical etching using an etching solution and ion etching (such as reactive ion etching).

Etching solutions that can be used for a process of selectively removing the porous Si by means of an etching solution include, beside a mixture solution of 49% hydrofluoric acid and 30% aqueous hydrogen peroxide, hydrofluoric acid, a mixture solution obtained by adding alcohol to hydrofluoric acid, a mixture solution obtained by adding alcohol and aqueous hydrogen peroxide to hydrofluoric acid, buffered hydrofluoric acid, a mixture solution obtained by adding alcohol to buffered hydrofluoric acid, a mixture solution obtained by adding aqueous hydrogen peroxide to buffered hydrofluoric acid, a mixture solution obtained by adding alcohol and aqueous hydrogen peroxide to buffered hydrofluoric acid and a mixture solution of hydrofluoric acid, nitric acid and acetic acid.

The semiconductor article having the transferred nonporous semiconductor layer may preferably be heat treated in a hydrogen-containing atmosphere, subsequently to the selective removal of the porous layer, to improve the flatness of the nonporous semiconductor layer.

Now, the present invention will be described by referring to the accompanying drawings that illustrate preferred modes of carrying out the invention.

First Mode of Carrying Out the Invention

In this mode of carrying out the invention, a $P^+$ layer 12 is formed by diffusion on the principal surface of a single crystal silicon substrate 11 (FIG. 1A). Thereafter, the $P^+$ layer on the principal surface is transformed into a porous state to a depth greater than the thickness of the $P^+$ layer to produce a $P^+$ porous silicon layer 13 and an underlying porous silicon layer 14 (FIG. 1B). Then, at least a single nonporous thin film 15 is formed on the $P^+$ porous silicon layer 13. Now, a first substrate is prepared. The nonporous thin film 15 may comprise single crystal Si, polycrystalline Si, noncrystalline Si, metal film, compound semiconductor thin film or superconductive thin film. The bonding interface can be separated from the active layer preferably by additionally forming an uppermost $SiO_2$ layer. Referring to FIG. 1C, a surface of the second substrate 16 and a corresponding surface of the first substrate are brought into close contact so that they may be bonded together to produce a multilayer structure having the nonporous thin film 15 located inside. Subsequently, the bonding strength between the two substrates can be increased by means of anodic bonding, pressurization, heat treatment, if appropriate, or a combination of any of these.

When a single crystal Si layer is produced by deposition, preferably silicon oxide is formed on the surface of the single crystal Si layer typically by thermal oxidation before the substrates are bonded together. The second substrate may be any of the above listed candidates. While FIG. 1C shows a second substrate bonded to a first substrate with an insulation layer 17 arranged therebetween, the insulation layer 17 may be omitted when the nonporous thin film 15 or the second substrate is not made of Si. A thin insulating panel may be arranged between the first and second substrates when bonding them together.

When the nonporous thin film is made of epitaxially grown single crystal silicon or some other similar material, the pores inside the porous Si layer can be rearranged and closed to reduce the etchability of the porous Si layer at the time of etching if it is subjected to heat treatment during the process of epitaxial growth or in a subsequent process. In order to avoid this problem and improve the structural stability of the porous layer, the porous Si layer is preferably subjected to a preliminary heat treatment operation that is conducted at temperature between 200 and 700° C. to form a thin oxide film on the wall surface of the pores (while maintaining the properties of porous single crystal silicon) and prevent any possible rearrangement of the pores.

A step as will be described below can be employed to produce an epitaxial silicon film that is substantially free from defects.

While a porous Si layer maintains the structure of single crystal silicon, the epitaxial silicon film formed on the surface can show defects attributable to the numerous pores existing on the surface of the porous Si layer. Therefore, it may be a good idea to hermetically close the surface of the porous Si layer that is brought into contact with the epitaxial film by means of single crystal Si.

A technique that can be used for hermetically closing the surface of the porous Si layer is a heat treatment operation to be conducted in a hydrogen-containing atmosphere. As a result of this heat treatment using hydrogen, some of the silicon atoms on the surface of the porous Si layer will be migrated to hermetically close the pores exposed to the surface of the porous Si layer. This heat treatment operation is typically conducted at temperature between 500 and 1,300° C., preferably between 900 and 1,300° C.

Apart from this technique, it may also be effective to form a silicon film on the surface of the porous Si layer at a very low rate to close the pores exposed to the surface of the layer by allowing gas that contains silicon atoms to flow into the film forming chamber.

In the above described process of closing the pores exposed to the surface of the porous Si layer and forming a silicon film by epitaxial growth after the formation of a thin oxide film on the wall surface of the pores, the single crystal is preferably exposed at the top of the porous Si layer to effectively close the pores. The single crystal can be exposed by immersing the upper surface of the porous Si layer whose pores have been coated with thin oxide film in an acid such as HF to remove the thin oxide film arranged on the upper surface.

Thereafter, the two substrates are separated along the porous silicon layer 14 (FIG. 1D). Any of the above described techniques may be used for separating the substrates.

While the two substrates may be separated mainly along the fragile underlying porous silicon layer 14, they may partly or totally be separated through the $P^+$ porous silicon layer 13 without any problem.

Thereafter, the porous Si layers 13 and 14 are selectively removed. If the nonporous thin film is made of single crystal Si, only the porous Si layers 13 and 14 are etched off by nonelectrolytic wet chemical etching by using an etching solution prepared for ordinary Si etching, hydrofluoric acid that is an etching solution for selectively etching porous Si, a mixture solution obtained by adding at least either alcohol or aqueous hydrogen peroxide to hydrofluoric acid, buffered hydrofluoric acid or a mixture solution obtained by adding at least either ethanol or aqueous hydrogen peroxide to buffered hydrofluoric acid to leave the film that has been formed on the first. substrate in advance on the second substrate. As described above in detail, it is possible to selectively etch only the porous Si by means of an etching solution prepared for ordinary Si etching because of the large surface area of the porous Si layers 13 and 14. Alternatively, the porous Si layers 13 and 14 may be selectively removed by polishing, using the nonporous thin film layer 15 as a polishing stopper.

When a compound semiconductor layer is formed on the porous Si layer, an etching solution that provides a high Si etching rate relative to the compound semiconductor is used to chemically etch only the porous Si layers 13 and 14, leaving the thin single crystal compound semiconductor film layer 15 on the second substrate 16. Alternatively, the porous Si layers 13 and 14 may be selectively removed by polishing, using the single crystal compound semiconductor layer 15 as a polishing stopper.

FIG. 1E shows a semiconductor article that can be produced by a method according to the invention. A large nonporous thin film which is typically a single crystal Si thin film 15 is evenly and thinly formed on the entire surface of the second substrate 16. If an insulating substrate is used for the second substrate 16, the prepared semiconductor substrate can advantageously be used for producing electronic devices that are insulated and separated from each other.

Once the residual porous Si on the first single crystal Si substrate 11 is removed from the latter, the latter can be used as another first single crystal Si substrate 11 or as another second substrate 16 after smoothing the surface if the surface has turned impermissibly coarse and such a smoothing operation is necessary.

Second Mode of Carrying Out the Invention

FIGS. 2A through 2E illustrate a second mode of carrying out the invention. As shown, a $P^+$ layer 22 is formed on each of the oppositely disposed surfaces of a single crystal silicon substrate 21 that constitutes a first substrate by means of a diffusion technique (FIG. 2A). Then, the first substrate is transformed into a porous state on the both sides to a depth greater than the thickness of the $P^+$ layers 22 to produce $P^+$ porous layers 23 and an underlying porous silicon layer 24 (FIG. 2B). Subsequently, a nonporous thin film 25 is formed on each $P^+0$ porous layer 23 and then second substrates 26 and 27 are bonded to the respective sides with an insulation layer 28 disposed therebetween (FIG. 2C). Thus, it will be appreciated that a pair of semiconductor articles are prepared in a single process. Otherwise, the manufacturing steps of this mode are identical with those of the above-described first mode.

Once the residual porous Si on the single crystal Si substrate 21 is removed from the latter, the latter can be used as another first single crystal Si substrate 21 or as another second substrate 26 (or 27) after smoothing the surface if the surface has turned impermissibly coarse and such a smoothing operation is necessary.

The support substrates 26, 27 may have respective thicknesses that are different from each other. The nonporous thin films 25 on the opposite surfaces of the first substrate may be made of respective materials and have respective thicknesses that are different from each other.

Now, the present invention will be described further by way of examples.

EXAMPLE 1

A 5 μm thick $P^+$ high concentration layer was formed as a surface layer of a single crystal silicon substrate having an unspecified electric resistance by means of a diffusion technique. Another $P^+$ high concentration layer was also formed on the rear surface of the substrate.

More specifically, the $P^+$ high concentration layer was formed in the following manner. A solution prepared by dissolving $B_2O_3$ into a solvent was applied to the principal surface of a Si substrate by means of a spin-coating technique, which was then baked at 140° C. to dissipate the solvent. The resultant substrate was then placed in a diffusion furnace and subjected to a so-called driven-in diffusion process to produce a $P^+$ high concentration layer, maintaining the temperature of the furnace tube to 1,200° C. for six hours. The spin-coated film was removed.

Subsequently, the Si substrate carrying thereon a $P^+$ high concentration layer was immersed in a HF solution to carry out an anodization process from the first surface side of the substrate and produce a porous layer on the first surface side. The anodization was conducted under the following conditions.

current density: 7 (mA·cm$^{-2}$)
anodization solution: HF:$H_2O$:$C_2H_5OH$=1:1:1
duration: 11 (min.)
thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: $SiH_2Cl_2$/$H_2$
gas flow rate: 0.5/180 l/min.
gas pressure: 80 Torr
temperature: 950° C.
growth rate: 0.3 μm/min.

Additionally, a $SiO_2$ layer was formed to a thickness of 100 nm by thermally oxidizing the surface of the epitaxially grown Si layer.

The surface of the $SiO_2$ layer and the corresponding surface of an Si substrate (second substrate) carrying a 500 nm thick $SiO_2$ layer thereon and prepared in advance were brought into contact with each other and put together to produce a multilayer structure. The 100 nm thick $SiO_2$ layer and the epitaxial Si layer were removed by etching from an edge of the bonded wafer to expose an edge of the porous silicon layer.

Subsequently, the bonded wafer was subjected to pyrooxidation at 1,000° C. to completely separate the two substrate along the lower porous silicon layer within 50 minutes. The separated surfaces were observed to find out that the porous silicon had been transformed into $SiO_2$ on the outer periphery of the wafer, while it remained unaffected in a central area.

Thereafter, the porous Si layer and the oxidized porous Si layer remaining on the second substrate were selectively etched off in a mixture solution of 49% hydrofluoric acid and 30% aqueous hydrogen peroxide, stirring the solution constantly. The single crystal Si was left unetched and operated as an etching stopper so that the porous Si and the oxidized porous Si were selectively etched and removed completely.

The rate of etching nonporous single crystal Si by means of the above-cited etching solution is very low. The selectivity ratio of the rate of etching porous Si relative to that of etching nonporous single crystal Si is as large as more than $10^5$, so that the reduction by etching of the height of the nonporous layer (about tens of several angstroms) is practically negligible.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the root mean square of surface roughness (Rrms) within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si and the oxidized porous silicon remaining on the first substrate were also selectively etched off in a mixture solution of 49% hydrofluoric acid and 30% aqueous hydrogen peroxide, stirring the solution constantly. The single crystal Si was left unetched and operated as an etching stopper so that the porous Si and the oxidized porous Si were selectively etched and removed completely and the first substrate could be used for another diffusion process of the high concentration P$^+$ layer as another first substrate or for another oxide film forming process as a second substrate.

EXAMPLE 2

A 5 μm thick P$^+$ high concentration layer was formed as a surface layer of a single crystal silicon substrate having an unspecified electric resistance by means of a diffusion technique as in the case of Example 1. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)
anodization solution: HF:$H_2O$:$C_2H_5OH$=1:1:1
duration: 11 (min.)
thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: $SiH_2Cl_2$/$H_2$
gas flow rate: 0.5/180 l/min.
gas pressure: 80 Torr
temperature: 950° C.
growth rate: 0.3 μm/min.

Additionally, a $SiO_2$ layer was formed to a thickness of 100 nm by thermally oxidizing the surface of the epitaxially grown Si layer.

The surface of the $SiO_2$ layer and the corresponding surface of a Si substrate (second substrate) carrying a 500 nm thick $SiO_2$ layer thereon and prepared in advance were brought into contact with each other and put together.

After removing the oxide film on the rear surface of the Si substrate, a $CO_2$ laser beam was irradiated on the entire Si substrate side surface of the wafer with an output power level of 500 to 1,000 W. The $CO_2$ laser was absorbed by the 500 nm thick $SiO_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration $P^+$ layer as another first substrate or for another oxide film forming process as a second substrate.

EXAMPLE 3

A 5 μm thick $P^+$ high concentration layer was formed as a surface layer of a single crystal silicon substrate having an unspecified electric resistance by means of a diffusion technique. Another $P^+$ high concentration layer was also formed on the rear surface of the substrate.

More specifically, the $P^+$ high concentration layer was formed by means of a diffusion technique in the following manner. A Si substrate was placed in a diffusion furnace and then $N_2$ gas was introduced into a liquid diffusion source containing $BBr_3$ for bubbling. The produced gas was then introduced into the furnace tube with a mixture carrier gas of ($N_2+O_2$). A $B_2O_3$ layer was formed by maintaining the temperature of the furnace tube to 1,050° C. for an hour and subsequently the substrate was subjected to a so-called driven-in diffusion process to produce a $P^+$ high concentration layer, maintaining the temperature of the furnace tube to 1,200° C. for six hours.

Then, the high concentration surface layer of the single crystal Si substrate was subjected to anodization in an HF solution. The anodization was conducted under the following conditions.

current density: 7 ($mA \cdot cm^{-2}$)
anodization solution: $HF:H_2O:C_2H_5OH=1:1:1$
duration: 11 (min.)
thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 μm/min.

Additionally, a $SiO_2$ layer was formed to a thickness of 100 nm by thermally oxidizing the surface of the epitaxially grown Si layer.

The surface of the $SiO_2$ layer and the corresponding surface of a Si substrate (second substrate) carrying a 500 nm thick $SiO_2$ layer thereon and prepared in advance were brought into contact with each other and put together.

A pulsated electric current of about 10 to 100 A was made to flow only through the high concentration $P^+$ single crystal Si layer of the first substrate. The electric current was made to flow by removing the $SiO_2$ to expose the high concentration $P^+$ single crystal Si layer at an end surface of the wafer and pinching the wafer by means of + and − electrodes that touch only the end surface. As a result, the underlying porous Si layer was abruptly subjected to thermal stress to sever the two substrates along the underlying porous Si layer.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely and the first substrate could be used for another diffusion process of the high concentration $P^+$ layer as another first substrate or for another oxide film forming process as a second substrate.

EXAMPLE 4

A 5 μm thick $P^+$ high concentration first layer was formed as a surface layer of a single crystal silicon substrate having an unspecified electric resistance by means of a diffusion technique as in the case of Example 3. Another $P^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)
anodization solution: HF:H$_2$O:C$_2$H$_5$OH=1:1:1
duration: 11 (min.)
thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) carrying a 500 nm thick SiO$_2$ layer thereon and prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another diffusion process of the high concentration P$^+$ layer as another first substrate or for another oxide film forming process as a second substrate.

EXAMPLE 5

A 5 μm thick P$^+$ high concentration layer was formed as a surface layer of a single crystal silicon substrate having an unspecified electric resistance by means of a diffusion technique as in the case of Example 1. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)
anodization solution: HF:H$_2$O:C$_2$H$_5$OH=1:1:1
duration: 11 (min.)
thickness of the porous Si layer: 12 (μm)

The resulting silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) carrying a 500 nm thick SiO$_2$ layer thereon and prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Then, the porous Si remaining on the second substrate was also selectively and completely etched in an HF/HNO$_3$/CH$_3$COOH type etching solution. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in an etching solution of HF/HNO$_3$/CH$_3$COOH, stirring the solution constantly. The single crystal Si was left unetched and operated as an etching stopper so that the porous Si was selectively etched and removed completely. The first substrate could be used for another diffusion process of the high concentration P$^+$ layer as another first substrate or for another oxide film forming process as a second substrate.

EXAMPLE 6

A 5 μm thick P$^+$ high concentration layer was formed as a surface layer of a single crystal silicon substrate having an unspecified electric resistance by means of a diffusion technique as in the case of Example 1. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)

anodization solution: HF:H$_2$O:C$_2$H$_5$OH=1:1:1 duration: 11 (min.)

thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$ gas flow rate: 0.5/180 l/min.

gas pressure: 80 Torr temperature: 950° C.

growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a quartz substrate (second substrate) prepared in advance were exposed to nitrogen plasma and then put together to bring them into contact with each other. The combined substrates were then annealed at 200° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the quartz substrate. The thickness of the formed single crystal Si layer was observed at 100 points spreading over the entire surface of the substrate to find that the uniformity of the film thickness was 101 nm±3 nm.

Then, the substrate was subjected to a heat treatment operation at 970° C. for two hours in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another diffusion process of the high concentration P$^+$ layer as another first substrate.

EXAMPLE 7

A 5 μm thick P$^+$ high concentration first layer was formed as a surface layer of a single crystal silicon substrate having an unspecified electric resistance by means of a diffusion technique as in the case of Example 3. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)

anodization solution: HF:H$_2$O:C$_2$H$_5$OH=1:1:1 duration: 11 (min.)

thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.55 μm on the porous Si layer by means of a CVD (chemical vapor deposition) technique. This operation was conducted under the following conditions.

source gas: SiH$_2$Cl$_2$/H$_2$ gas flow rate: 0.5/180 l/min.

gas pressure: 80 Torr temperature: 950° C.

growth rate: 0.3 μm/min.

Additionally, a SiO$_2$ layer was formed to a thickness of 100 nm by thermally oxidizing the surface of the a epitaxially grown Si layer.

The surface of the SiO$_2$ layer and the corresponding surface of a Si substrate (second substrate) carrying a 500 nm thick SiO$_2$ layer thereon and prepared in advance were brought into contact with each other and put together. Thereafter, the 100 nm thick SiO$_2$ layer and the epitaxial Si layer were removed by etching from an edge of the bonded wafer to expose an end of the porous silicon layer.

Subsequently, the bonded wafer was subjected to pyro-oxidation at 1,000° C. to completely separate the two substrates along the lower porous silicon layer within 50 minutes. The separated surfaces were observed to find out that the porous silicon had been transformed into SiO$_2$ on the outer periphery of the wafer, while it remained unaffected in a central area.

Thereafter, the porous Si layer and the oxidized porous Si layer remaining on the second substrate were selectively etched off in a solution mixture of 49% hydrofluoric acid and 30% aqueous hydrogen peroxide, stirring the solution constantly. The single crystal Si was left unetched and operated as an etching stopper so that the porous Si and the oxidized porous Si were selectively etched and removed completely.

The rate of etching nonporous single crystal Si by means of the above-cited etching solution is very low and the selectivity ratio of the rate of etching porous Si relative to that of etching nonporous single crystal Si is as large as more than 10$^5$ so that the reduction by etching of the height of the nonporous layer (about tens of several angstroms) is practically negligible.

Thus, a single crystal Si layer was formed to a thickness of 0.5 μm on the silicon oxide film. The thickness of the formed single crystal Si layer was observed at 100 points spreading over the entire surface of the substrate to find that the uniformity of the film thickness was 500 nm±15 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si and the oxidized porous silicon remaining on the first substrate were also selectively etched off in a mixture solution of 49% hydrofluoric acid and 30% aqueous hydrogen peroxide, stirring the solution constantly. The single crystal Si was left unetched and operated as an etching stopper so that the porous Si and the oxidized porous Si were selectively etched and removed completely. The first substrate could be used for another diffusion process of the high concentration P$^+$ layer as another first substrate or for another oxide film forming process as a second substrate.

EXAMPLE 8

A 5 μm thick P$^+$ high concentration layer was formed as a surface layer of a single crystal silicon substrate of a regenerated wafer by means of a diffusion technique as in the case of Example 3. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)

anodization solution: HF:H$_2$O:C$_2$H$_5$OH=1:1:1 duration: 11 (min.)

thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$ gas flow rate: 0.5/180 l/min.

gas pressure: 80 Torr temperature: 950° C.

growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) carrying a 500 nm thick SiO$_2$ layer thereon and prepared in advance were brought into contact with each other and put together.

After removing the oxide film on the rear surface of the Si substrate, a CO$_2$ laser beam was irradiated on the entire Si substrate side surface of the wafer with an output power level of 500 to 1000 W. The CO$_2$ laser was absorbed by the 500 nm thick SiO$_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another diffusion process of the high concentration $P^+$ layer as another first substrate or for another oxide film forming process as a second substrate.

EXAMPLE 9

A 5 μm thick $P^+$ high concentration first layer was formed as a surface layer of a single crystal silicon substrate having an unspecified electric resistance by means of a diffusion technique as in the case of Example 1. Another $P^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)

anodization solution: HF:H$_2$O:C$_2$H$_5$OH=1:1:1 duration: 11 (min.)

thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal GaAs was made to epitaxially grow to a thickness of 1 μm on the porous Si layer by means of a MOCVD (metal organic chemical vapor deposition) technique. This operation was conducted under the following conditions.

source gas: TMG/AsH$_3$/H$_2$ gas pressure: 80 Torr temperature: 700° C.

The surface of the GaAs layer and the corresponding surface of a Si substrate (second substrate) prepared in advance were brought into contact with each other and put together.

A pulsated electric current of about 10 to 100 A was made to flow only through the high concentration $P^+$ single crystal Si layer of the first substrate. The electric current was made to flow by removing the SiO$_2$ to expose the high concentration $P^+$ single crystal Si layer at an end surface of the wafer and pinching the wafer by means of + and − electrodes that touch only the end surface. As a result, the underlying porous Si layer was abruptly subjected to thermal stress to sever the two substrates along the underlying porous Si layer.

Thereafter, the residual porous Si layer on the second substrate was etched off by means of:

ethylenediamine+pyrocatechol+water (at a ratio of 17 ml:3 g:8 ml) at 110° C.

The single crystal GaAs was left unetched and operated as an etching stopper so that the porous Si and the oxidized porous Si were selectively etched and removed completely.

The rate of etching nonporous single crystal GaAs by means of the above-cited etching solution is very low and the reduction by etching of the height of the nonporous layer (about tens of several angstroms) is practically negligible.

Thus, a single crystal GaAs layer was formed to a thickness of 1 μm on the silicon oxide film. The thickness of the formed single crystal GaAs layer was observed at 100 points spreading over the entire surface of the substrate to find that the degree of uniformity of the film thickness was 1 μm±29.8 nm.

When a cross-section was observed through a transmission electron microscope, it was confirmed that no new crystal defects had been introduced in the GaAs layer and an excellent degree of crystallinity had been maintained.

For the purpose of comparison, a GaAs layer was formed on an insulation film by using a Si substrate carrying thereon an oxide film as a support substrate to obtain the above-identified results.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another diffusion process of the high concentration $P^+$ layer as another first substrate or for another bonding process as a second substrate.

EXAMPLE 10

A 5 μm thick $P^+$ high concentration layer was formed as a surface layer of a single crystal silicon substrate having an unspecified electric resistance by means of a diffusion technique as in the case of Example 1. Another $P^+$ high concentration layer was also formed on the rear surface of the substrate. The high concentration surface layer of the single crystal Si substrate was subjected to anodization in an HF solution. The anodization was conducted under the following conditions.

current density: 7 (mA·cm$^{-2}$)

anodization solution: HF:H$_2$O:C$_2$H$_5$OH=1:1:1 duration: 11 (min.)

thickness of the porous Si layer: 12 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film. Single crystal InP was made to epitaxially grow to a thickness of 1 μm on the porous Si layer by means of a MOCVD (metal organic chemical vapor deposition) technique.

The surface of the InP layer and that of a quartz substrate (second substrate) prepared in advance were brought into contact with each other and put together. The combined substrates were annealed at 200° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a mixture solution of 49% hydrofluoric acid and 30% aqueous hydrogen peroxide, stirring the solution constantly. The single crystal InP was left unetched and operated as an etching stopper so that the porous Si was selectively etched and removed completely.

Thus, a single crystal InP layer was formed to a thickness of 1 μm on the silicon oxide film. The thickness of the formed single crystal InP layer was observed at 100 points spreading over the entire surface of the substrate to find that the degree of uniformity of the film thickness was 1 μm×29.0 nm.

When a cross section was observed through a transmission electron microscope, it was confirmed that no new crystal defects had been introduced in the InP layer and an excellent degree of crystallinity had been maintained.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another diffusion process of the high concentration P$^+$ layer as another first substrate.

EXAMPLE 11

A 5 μm thick P$^+$ high concentration first layer was formed as a surface layer on the two opposite sides of a double mirror single crystal silicon substrate having an unspecified electric resistance by means of a diffusion technique as in the case of Example 1. The high concentration surface layer of the single crystal Si substrate was subjected to anodization in a HF solution from the rear surface side. The anodization was conducted under the following conditions. The anodizating operation was conducted on one of the surfaces at a time for 11 minutes.

current density: 7 (mA·cm$^{-2}$)
anodization solution: HF:H$_2$O:C$_2$H$_5$OH=1:1:1
duration: 11×2 (min.)
thickness of the porous Si layer: 12 (μm)

Each of the resulting porous silicon layers had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on each of the porous Si layers by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 μm/min.

Additionally, a SiO$_2$ layer was formed to a thickness of 100 nm by thermally oxidizing the surface of each of the epitaxially grown Si layers.

The surface of each of the SiO$_2$ layers and the corresponding surface of a Si substrate (second substrate) carrying a 500 nm thick SiO$_2$ layer thereon and prepared in advance were brought into contact with each other and put together so that the first substrate was sandwiched by a pair of second substrates. Thereafter, the 100 nm thick SiO$_2$ layer and the epitaxial Si layer were removed by etching from an edge of the bonded wafer to expose an end of the porous silicon layer.

Subsequently, the bonded wafer was subjected to pyrooxidation at 1,000° C. to completely separate the two substrate along the lower porous silicon layer within 50 minutes. The oxidation process is preferably conducted for several hours in order to minimize any deviations among wafers. The separated surfaces were observed to find out that the porous silicon had been transformed into SiO$_2$ on the outer periphery of the wafer, while it remained unaffected in a central area.

Thereafter, the porous Si layers and the oxidized porous Si layers remaining on the two second substrates were selectively etched off in a mixture solution of 49% hydrofluoric acid and 30% aqueous hydrogen peroxide, stirring the solution constantly. The single crystal Si was left unetched and operated as an etching stopper so that the porous Si and the oxidized porous Si were selectively etched and removed completely.

Thus, a pair of 0.1 μm thick single crystal Si layers were formed on the silicon oxide film. The thickness of each of the formed single crystal Si layers was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si and the oxidized porous silicon remaining on the first substrate were also selectively etched off in a solution mixture of 49% hydrofluoric acid and 30% aqueous hydrogen peroxide, stirring the solution constantly. The single crystal Si was left unetched and operated as an etching stopper o that the porous Si and the oxidized porous Si were selectively etched and removed completely. The first substrate could be used for another diffusion process of the high concentration P$^+$ layer as another first substrate or for another oxide film forming process as a second substrate.

EXAMPLE 12

A 10 μm thick P$^+$ high concentration first layer was formed as a surface layer of a single crystal silicon substrate having an unspecified electric resistance by means of a diffusion technique as in the case of Example 1 except that the drive-in diffusion process was conducted for 10 hours. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)

anodization solution: HF:H$_2$O:C$_2$H$_5$OH=1:1:1 duration: 15 (min.)

thickness of the porous Si layer: 16 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$ gas flow rate: 0.5/180 l/min.

gas pressure: 80 Torr temperature: 950° C.

growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) prepared in advance were brought into contact with each other and put together. Thereafter, the wafer was heat treated at 1,180° C. for five minutes to improve the bonding strength.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another diffusion process of the high concentration P$^+$ layer as another first substrate or for another oxide film forming process as a second substrate.

EXAMPLE 13

A 10 μm thick P$^+$ high concentration first layer was formed as a surface layer of a single crystal silicon substrate having an unspecified electric resistance by means of a diffusion technique as in the case of Example 1 except that the drive-in diffusion process was conducted for 10 hours. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)

anodization solution: HF:H$_2$O:C$_2$H$_5$OH=1:1:1 duration: 15 (min.)

thickness of the porous Si layer: 16 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$ gas flow rate: 0.5/180 l/min.

gas pressure: 80 Torr temperature: 950° C.

growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) carrying 500 nm thick SiO$_2$ layer thereon and prepared in advance were brought into contact with each other and put together. Thereafter, the wafer was heat treated at 1,180° C. for five minutes to improve the bonding strength.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another diffusion process of the high concentration P$^+$ layer as another first substrate or for another bonding process as a second substrate.

EXAMPLE 14

A 5 μm thick P$^+$ high concentration layer was formed as a surface layer of a single crystal silicon substrate of a regenerated wafer by means of a diffusion technique. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)
anodization solution: HF:H$_2$O:C$_2$H$_5$OH=1:1:1
duration: 15 (min.)
thickness of the porous Si layer: 16 (μm)

The obtained porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr temperature: 950° C.
growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) carrying a 500 nm thick SiO$_2$ layer thereon and prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another diffusion process of the high concentration P$^+$ layer as another first substrate or for another oxide film forming process as a second substrate.

EXAMPLE 15

A 5 μm thick P$^+$ high concentration layer was formed as a surface layer of a single crystal silicon substrate of a regenerated wafer by means of a diffusion technique as in the case of Example 1. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)
anodization solution: HF:H$_2$O:C$_2$H$_5$OH=1:1:1
duration: 15 (min.)
thickness of the porous Si layer: 16 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with a thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of an Si substrate (second substrate) prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

Finally, the porous Si remaining on the first substrate was also selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another diffusion process of the high concentration P$^+$ layer as another first substrate or for another bonding process as a second substrate.

EXAMPLE 16

A 5 μm thick P$^+$ high concentration layer was formed as a surface layer of a single crystal silicon substrate of a regenerated wafer by means of a diffusion technique as in the case of Example 1. Another P$^+$ high concentration layer was also formed on the rear surface of the substrate. The high concentration surface layer of the single crystal Si substrate was subjected to anodization in a HF solution. The anodization was conducted under the following conditions.

current density: 7 (mA·cm$^{-2}$)
anodization solution: HF:H$_2$O:C$_2$H$_5$OH=1:1:1
duration: 15 (min.)
thickness on the porous Si layer: 16 (μm)

The resulting porous silicon layer had a double-layered structure, of which the underlying lower porous silicon layer showed a minute and fragile structure if compared with the upper surface layer.

The substrate was then oxidized at 400° C. for an hour in an oxygen atmosphere. As a result of the oxidation, the wall surfaces of the pores of the porous Si were covered with thermally oxidized film of silicon.

Thereafter, the thin oxide film produced on the uppermost surface of the substrate where the porous layer had been formed was removed by immersing it in a 1.25% HF solution. Subsequently, the obtained substrate was subjected to heat treatment at 1,050° C. and 76 Torr for 1 minute in a flow of H$_2$ flowing at a rate of 230 l/min. and for more 5 minutes after adding SiH$_4$ by 50 sccm.

Then, single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) prepared in advance were exposed to nitrogen plasma (in order to improve the bonding strength) and then laid one on the other to bring them into contact with each other. The combined substrates were then annealed at 400° C. for 10 hours.

When evenly distributed and sufficiently strong tensile force was applied onto the entire surface of the bonded wafer in a direction perpendicular to the surface, the substrates were separated along the underlying lower porous silicon layer that was very fragile. A similar result was obtained when pressure or shearing force was used in place of the tensile force. The substrates could also be separated from each other along the fragile lower porous silicon layer by driving a knife into a gap between the bonded two substrates.

Thereafter, the residual porous Si layer on the second substrate was selectively etched off in a solution mixture of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross-section was observed through a transmission electron microscope, it was confirmed that no new crystal defects had been introduced in the Si layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another diffusion process of the high concentration $P^+$ layer as another first substrate or for another bonding process as a second substrate.

What is claimed is:

1. A method of manufacturing a semiconductor article, characterized by comprising steps of:
    forming a diffusion region at least on the surface of one of the sides of a silicon substrate by diffusing an element capable of controlling the conduction type;
    forming a porous silicon layer in a region including said diffusion region;
    preparing a first substrate by forming a nonporous semiconductor layer on said porous silicon layer;
    bonding said first substrate and a second substrate together to produce a multilayer structure with said nonporous semiconductor layer located inside;
    splitting said multilayer structure along said porous silicon layer but not along said diffusion region; and
    removing the porous silicon layer remaining on said split second substrate.

2. A method of manufacturing a semiconductor article according to claim 1, wherein said step of forming a diffusion region is performed by means of a diffusion technique.

3. A method of manufacturing a semiconductor article according to claim 2, wherein said element capable of controlling the conduction type is an element capable of controlling the conduction type of silicon to the n-type.

4. A method of manufacturing a semiconductor article according to claim 3, wherein said element capable of controlling the conduction type is selected from P, As and Sb.

5. A method of manufacturing a semiconductor article according to claim 2, wherein said element capable of controlling the conduction type is an element capable of controlling the conduction type of silicon to the p-type.

6. A method of manufacturing a semiconductor article according to claim 5, wherein said element capable of controlling the conduction type is B.

7. A method of manufacturing a semiconductor article according to claim 2, wherein said diffusion technique is adapted to thermally diffuse said element into said silicon substrate.

8. A method of manufacturing a semiconductor article according to claim 6, wherein said element capable of controlling the conduction type is supplied in the form of gas.

9. A method of manufacturing a semiconductor article according to claim 8, wherein said gas is $B_2H_6$.

10. A method of manufacturing a semiconductor article according to claim 6, wherein said element capable of controlling the conduction type is supplied in the form of liquid.

11. A method of manufacturing a semiconductor article according to claim 10, wherein said liquid is $BBr_3$.

12. A method of manufacturing a semiconductor article according to claim 6, wherein said element capable of controlling the conduction type is supplied in the form of solid.

13. A method of manufacturing a semiconductor article according to claim 12, wherein said solid is $B_2O_3$.

14. A method of manufacturing a semiconductor article according to claim 6, wherein said element capable of controlling the conduction type is supplied from a solid object arranged on said silicon substrate.

15. A method of manufacturing a semiconductor article according to claim 14, wherein said solid object is selected from CVD film, BSG and spin-coated film.

16. A method of manufacturing a semiconductor article according to claim 2, wherein the concentration of said element capable of controlling the conduction type and contained in said diffusion region is controlled within a range between $5.0 \times 10^{16}/cm^3$ and $5.0 \times 10^{20}/cm^3$.

17. A method of manufacturing a semiconductor article according to claim 16, wherein the concentration of said element capable of controlling the conduction type and contained in said diffusion region is controlled within a range between $1.0 \times 10^{17}/cm^3$ and $2.0 \times 10^{20}/cm^3$.

18. A method of manufacturing a semiconductor article according to claim 17, wherein the concentration of said element capable of controlling the conduction type and contained in said diffusion region is controlled within a range between $5.0 \times 10^{17}/cm^3$ and $1.0 \times 10^{20}/cm^3$.

19. A method of manufacturing a semiconductor article according to claim 2, wherein the thickness of said diffusion layer is controlled within a range between 100 Å and 100 μm.

20. A method of manufacturing a semiconductor article according to claim 19, wherein the thickness of said diffusion layer is controlled within a range between 500 Å and 50 μm.

21. A method of manufacturing a semiconductor article according to claim 20, wherein the thickness of said diffusion layer is controlled within a range between 5,000 Å and 30 μm.

22. A method of manufacturing a semiconductor article according to claim 1, wherein the thickness of said porous silicon layer is controlled within a range between 1 μm and 150 μm.

23. A method of manufacturing a semiconductor article according to claim 22, wherein the thickness of said porous silicon layer is controlled within a range between 2 μm and 80 μm.

24. A method of manufacturing a semiconductor article according to claim 23, wherein the thickness of said porous silicon layer is controlled within a range between 5 μm and 50 μm.

25. A method of manufacturing a semiconductor article according to claim 1, wherein a diffusion region and a porous layer are formed on each of the oppositely disposed surfaces of said silicon substrate and subsequently a non-porous semiconductor layer is formed on each of said porous layers.

26. A method of manufacturing a semiconductor article according to claim 1, wherein said step of splitting said multilayer structure is performed by externally applying force to said porous layer.

27. A method of manufacturing a semiconductor article according to claim 26, wherein said application of force is performed by applying pressure, tensile force in a direction perpendicular to the substrate surface or shearing force.

28. A method of manufacturing a semiconductor article according to claim 1, wherein said step of splitting said multilayer structure is performed by exposing the porous silicon at an end of the structure and subsequently oxidizing the bonded substrates.

29. A method of manufacturing a semiconductor article according to claim 1, wherein said step of splitting said multilayer structure is performed by heating said multilayer structure.

30. A method of manufacturing a semiconductor article according to claim 29, wherein said heating is performed by entirely heating said porous multilayer structure.

31. A method of manufacturing a semiconductor article according to claim 29, wherein said heating is performed by partly heating said multilayer structure.

32. A method of manufacturing a semiconductor article according to claim 31, wherein said heating is performed by means of laser irradiation.

33. A method of manufacturing a semiconductor article according to claim 32, wherein said laser is carbon dioxide laser.

34. A method of manufacturing a semiconductor article according to claim 31, wherein said heating is performed by flowing an electric current through said porous silicon layer.

35. A method of manufacturing a semiconductor article according to claim 1, wherein said porous silicon layer is obtained by anodizing said silicon substrate.

36. A method of manufacturing a semiconductor article according to claim 1, wherein said nonporous semiconductor layer comprises a single crystal silicon layer.

37. A method of manufacturing a semiconductor article according to claim 36, wherein said single crystal silicon layer is formed by means of epitaxial growth.

38. A method of manufacturing a semiconductor article according to claim 36, wherein said first substrate is prepared by forming a silicon oxide layer on said single crystal silicon layer.

39. A method of manufacturing a semiconductor article according to claim 38, wherein said silicon oxide layer is formed by means of thermal oxidation.

40. A method of manufacturing a semiconductor article according to claim 1, wherein said porous semiconductor layer comprises a compound semiconductor layer.

41. A method of manufacturing a semiconductor article according to claim 40, wherein said compound semiconductor layer has single crystal structure.

42. A method of manufacturing a semiconductor article according to claim 1, wherein said second substrate comprises a single crystal silicon substrate.

43. A method of manufacturing a semiconductor article according to claim 1, wherein said second substrate is prepared by forming oxide film on the surface of said single crystal silicon substrate.

44. A method of manufacturing a semiconductor article according to claim 1, wherein said second substrate comprises a light transmitting substrate.

45. A method of manufacturing a semiconductor article according to claim 44, wherein said light transmitting substrate comprises a glass substrate.

46. A method of manufacturing a semiconductor article according to claim 1, wherein said bonding step is performed by bringing the two substrate into close contact with each other.

47. A method of manufacturing a semiconductor article according to claim 1, wherein said bonding step is performed by means of anodic bonding, pressurization and heat treatment.

48. A method of manufacturing a semiconductor article according to claim 1, wherein said step of removing said porous silicon layer is performed by means of polishing.

49. A method of manufacturing a semiconductor article according to claim 1, wherein said step of removing said porous silicon layer is performed by means of etching.

50. A method of manufacturing a semiconductor article according to claim 49, wherein said etching is performed by using hydrofluoric acid.

51. A method of manufacturing a semiconductor article, characterized by comprising steps of:

forming a diffusion region at least on the surface of one of the sides of a silicon substrate by diffusing an element capable of controlling the conduction type;

forming a porous silicon layer in a region including said diffusion region;

preparing a first substrate by forming a nonporous semiconductor layer on said porous silicon layer;

bonding said first substrate and a second substrate together to produce a multilayer structure with said nonporous semiconductor layer located inside;

splitting said multilayer structure along said porous silicon layer but not along said diffusion region;

removing the porous silicon layer remaining on said split second substrate; and reusing the substrate obtained by removing the porous layer remaining on said separated first substrate as material of another first substrate.

52. A method of manufacturing a semiconductor article, characterized by comprising steps of:

forming a diffusion region at least on the surface of one of the sides of a silicon substrate by diffusing an element capable of controlling the conduction type;

forming a porous silicon layer in a region including said diffusion region;

preparing a first substrate by forming a nonporous semiconductor layer on said porous silicon layer;

bonding said first substrate and a second substrate together to produce a multilayer structure with said nonporous semiconductor layer located inside;

splitting said multilayer structure along said porous silicon layer but not along said diffusion region; removing the porous silicon layer remaining on said split second substrate; and reusing the substrate obtained by removing the porous layer remaining on said separated first substrate as material of another second substrate.

53. A method of manufacturing a semiconductor article, comprising:

forming a region incorporating an element capable of controlling the conduction type at least on the surface of a side of a silicon substrate;

forming a porous silicon layer in said region;

preparing a first substrate by forming a nonporous semiconductor layer on said porous silicon layer;

bonding said first substrate and a second substrate together to produce a multilayer structure with said nonporous semiconductor layer located inside;

splitting said multilayer structure along said porous silicon layer.

54. A method of manufacturing a semiconductor article, comprising:

forming a p-type region incorporating an element capable of controlling the conduction type at least on the surface of a side of a silicon substrate;

forming a porous silicon layer in said p-type region;

preparing a first substrate by forming a nonporous semiconductor layer on said porous silicon layer;

bonding said first substrate and a second substrate together to produce a multilayer structure with said nonporous semiconductor layer located inside;

splitting said multilayer structure along said porous silicon layer.

55. A method of manufacturing a semiconductor article, comprising:

forming a highly doped region incorporating an element capable of controlling the conduction type at least on the surface of one of the sides of a silicon substrate;

forming a porous silicon layer in said highly doped region;

preparing a first substrate by forming a nonporous semiconductor layer on said porous silicon layer;

bonding said first substrate and a second substrate together to produce a multilayer structure with said nonporous semiconductor layer located inside;

splitting said multilayer structure along said porous silicon layer.

* * * * *